United States Patent
Ikeda

(10) Patent No.: US 11,521,996 B2
(45) Date of Patent: Dec. 6, 2022

(54) IMAGING PANEL COMPRISING A PHOTOELECTRIC CONVERSION ELEMENT AND A FIRST PIXEL CIRCUIT, AND IMAGING DEVICE

(71) Applicant: SEMICONDUCTOR ENERGY LABORATORY CO., LTD., Atsugi (JP)

(72) Inventor: Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 36 days.

(21) Appl. No.: 17/257,448

(22) PCT Filed: Jul. 10, 2019

(86) PCT No.: PCT/IB2019/055856
§ 371 (c)(1),
(2) Date: Dec. 31, 2020

(87) PCT Pub. No.: WO2020/016704
PCT Pub. Date: Jan. 23, 2020

(65) Prior Publication Data
US 2021/0225912 A1 Jul. 22, 2021

(30) Foreign Application Priority Data
Jul. 20, 2018 (JP) .............................. JP2018-136582

(51) Int. Cl.
*H01L 27/146* (2006.01)
*H04N 5/378* (2011.01)
*H04N 5/3745* (2011.01)

(52) U.S. Cl.
CPC .. *H01L 27/14612* (2013.01); *H01L 27/14636* (2013.01); *H04N 5/378* (2013.01); *H04N 5/3745* (2013.01); *H01L 27/146* (2013.01)

(58) Field of Classification Search
CPC ......... H01L 27/14612; H01L 27/14636; H01L 27/146; H04N 5/3745; H04N 5/378;
(Continued)

(56) References Cited

U.S. PATENT DOCUMENTS 9,082,676 B2   7/2015   Kurokawa
9,264,693 B2   2/2016   Kurokawa
(Continued)

FOREIGN PATENT DOCUMENTS

JP   2013-175160 A   9/2013
JP   2013-224931 A   10/2013
(Continued)

OTHER PUBLICATIONS

International Search Report (Application No. PCT/IB2019/055856) dated Oct. 15, 2019.
(Continued)

*Primary Examiner* — Padma Haliyur
(74) *Attorney, Agent, or Firm* — Fish & Richardson P.C.

(57) ABSTRACT

An imaging panel is provided. The imaging panel includes a photoelectric conversion element, a pixel, a first conductive film, a second conductive film, a third conductive film, a fourth conductive film, and a fifth conductive film. The pixel includes a pixel circuit and supplies an image signal. The first conductive film is supplied with the image signal and the photoelectric conversion element includes a first terminal connected to the second conductive film and a second terminal connected to the pixel circuit. The pixel circuit includes a first switch, a second switch, a third switch, a transistor, and a capacitor. The first switch includes a terminal connected to the second terminal of the photoelectric conversion element and a terminal connected to a node. The transistor includes a gate electrode connected to the node and a first electrode connected to the third con-
(Continued)

ductive film. The second switch includes a terminal connected to a second electrode of the transistor and a terminal connected to the first conductive film. The third switch includes a terminal connected to the fourth conductive film and a terminal connected to the node. The capacitor includes a first electrode connected to the node and a second electrode connected to the fifth conductive film.

5 Claims, 17 Drawing Sheets

(58) Field of Classification Search
CPC .... H04N 5/37452; H04N 5/374; G01S 17/89; G01S 17/08
See application file for complete search history.

(56) References Cited

U.S. PATENT DOCUMENTS

| | | |
|---|---|---|
| 9,541,386 B2 | 1/2017 | Kurokawa |
| 10,498,980 B2 | 12/2019 | Ohmaru |
| 2013/0162778 A1 | 6/2013 | Kurokawa |
| 2013/0250274 A1 | 9/2013 | Kurokawa |
| 2016/0134789 A1* | 5/2016 | Inoue ................ H04N 5/37452 |
| | | 348/374 |
| 2017/0013214 A1 | 1/2017 | Ohmaru |
| 2020/0142229 A1 | 5/2020 | Kusunoki et al. |
| 2020/0193928 A1 | 6/2020 | Kawashima et al. |
| 2020/0194527 A1 | 6/2020 | Kawashima et al. |

FOREIGN PATENT DOCUMENTS

| | | |
|---|---|---|
| JP | 2017-022706 A | 1/2017 |
| KR | 2013-0107245 A | 10/2013 |
| WO | WO-2013/099537 | 7/2013 |
| WO | WO-2019/243949 | 12/2019 |

OTHER PUBLICATIONS

Written Opinion (Application No. PCT/IB2019/055856) dated Oct. 15, 2019.

* cited by examiner

FIG. 15A1
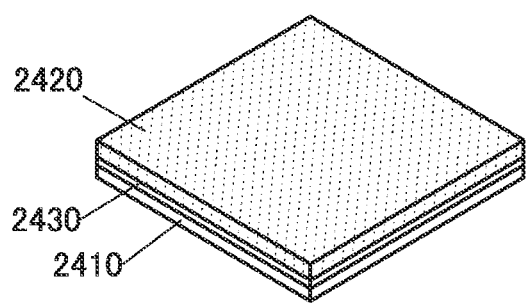
FIG. 15B1
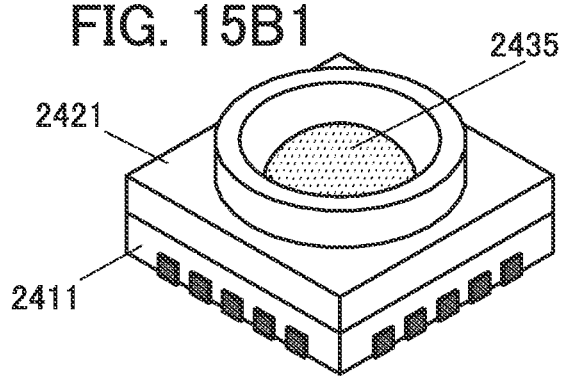
FIG. 15A2
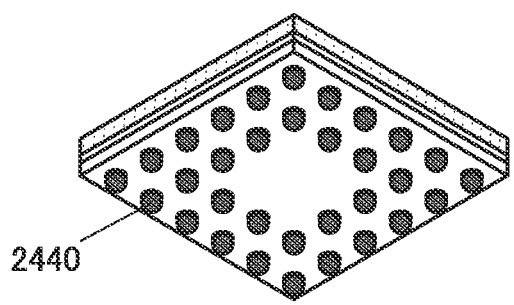
FIG. 15B2
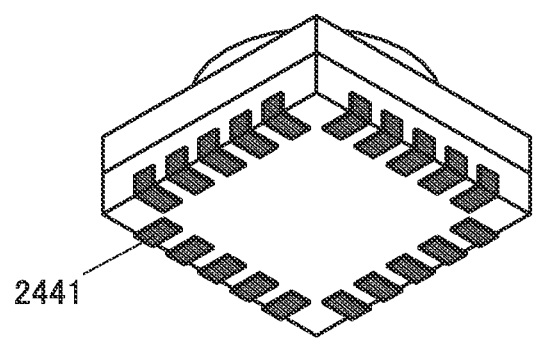
FIG. 15A3
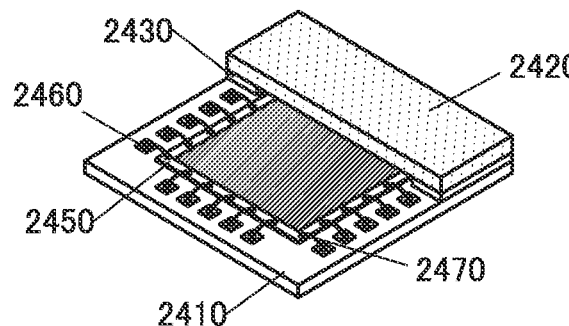
FIG. 15B3
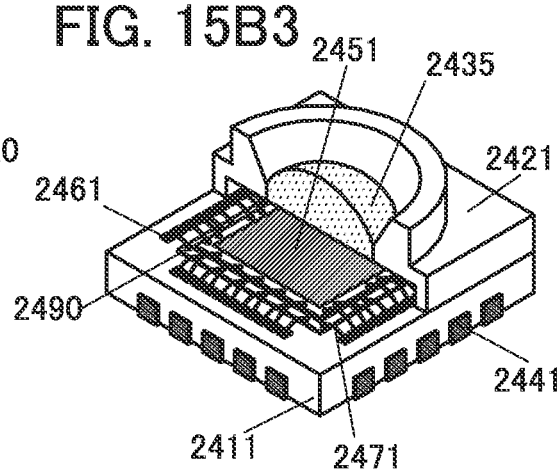

IMAGING PANEL COMPRISING A PHOTOELECTRIC CONVERSION ELEMENT AND A FIRST PIXEL CIRCUIT, AND IMAGING DEVICE

CROSS REFERENCE TO RELATED APPLICATIONS

This application is a U.S. National Phase Application under 35 U.S.C. § 371 of International Application PCT/IB2019/055856, filed on Jul. 10, 2019, which is incorporated by reference and claims the benefit of a foreign priority application filed in Japan on Jul. 20, 2018, as Application No. 2018-136582.

TECHNICAL FIELD

One embodiment of the present invention relates to an imaging panel, an imaging device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A structure in which a three-dimensional distance measurement sensor employing a TOF method is used for a motion recognition device has been known (Patent Document 1). With such a structure, detection of position change information or shape change information is simplified. In addition, detection of position change information or shape change information of an object to be detected that moves at high speed is simplified. Motion recognition is performed on the basis of pattern matching. Imaging data used for pattern matching is acquired from a three-dimensional distance measurement sensor. Object data is selected from imaging data of an object to be detected which changes over time, and motion data is estimated from change of the selected object data over time. The motion recognition device executes operation that is defined on the basis of output data generated from the motion data.

Moreover, a distance measurement device that includes a photosensor including a light-receiving element, a first transistor, and a second transistor; a wiring; a signal line; and a power supply line has been known. The wiring is electrically connected to one electrode of the light-receiving element, the signal line is electrically connected to a gate electrode of the first transistor, the power supply line is electrically connected to one of a source electrode and a drain electrode of the second transistor, one of a source electrode and a drain electrode of the first transistor is electrically connected to a gate electrode of the second transistor, and the other of the source electrode and the drain electrode of the first transistor is electrically connected to the other electrode of the light-receiving element and the other of the source electrode and the drain electrode of the second transistor (Patent Document 2).

REFERENCE

Patent Document

[Patent Document 1] Japanese Published Patent Application No. 2013-175160
[Patent Document 2] Japanese Published Patent Application No. 2013-224931

SUMMARY OF THE INVENTION

Problems to be Solved by the Invention

An object of one embodiment of the present invention is to provide a novel imaging panel that is highly convenient or reliable. Another object is to provide a novel imaging device that is highly convenient or reliable. Another object is to provide a novel imaging panel, a novel imaging device, or a novel semiconductor device.

Note that the description of these objects does not preclude the existence of other objects. One embodiment of the present invention does not need to achieve all these objects. Other objects are apparent from the description of the specification, the drawings, the claims, and the like, and other objects can be derived from the description of the specification, the drawings, the claims, and the like.

Means for Solving the Problems (1) One embodiment of the present invention is an imaging panel including an imaging region.

The imaging region includes a photoelectric conversion element, a first pixel, a first conductive film, a second conductive film, a third conductive film, a fourth conductive film, and a fifth conductive film.

The first pixel includes a first pixel circuit and the first pixel supplies a first image signal. The first conductive film is supplied with the first image signal.

The photoelectric conversion element includes a first terminal electrically connected to the second conductive film and a second terminal electrically connected to the first pixel circuit.

The first pixel circuit includes a first switch, a second switch, a third switch, a transistor, and a capacitor.

The first switch includes a first terminal electrically connected to the second terminal of the photoelectric conversion element and a second terminal electrically connected to a node.

The transistor includes a gate electrode electrically connected to the node and a first electrode electrically connected to the third conductive film.

The second switch includes a first terminal electrically connected to a second electrode of the transistor and a second terminal electrically connected to the first conductive film.

The third switch includes a first terminal electrically connected to the fourth conductive film and a second terminal electrically connected to the node.

The capacitor includes a first electrode electrically connected to the node and a second electrode electrically connected to the fifth conductive film.

Accordingly, the potential of the node can be changed in accordance with the amount of light exposure. Alternatively, the amount of light exposure can be recorded in the node. Alternatively, the potential of the node can be changed using the potential of the fifth conductive film. Alternatively, the potential of the fifth conductive film can be added to the potential of the node. Alternatively, arithmetic operation can be performed in the first pixel. As a result, a novel imaging panel that is highly convenient or reliable can be provided.

(2) In another embodiment of the present invention, the first switch includes a first transistor and the first transistor includes an oxide semiconductor. In the imaging panel, the second switch includes a second transistor and the second transistor includes an oxide semiconductor.

Accordingly, a current flowing through the first switch and the second switch that are in a non-conduction state can be lower than that of a transistor using silicon as a semiconductor. Alternatively, the retention time of the potential of the node can be long. As a result, a novel imaging panel that is highly convenient or reliable can be provided.

(3) Another embodiment of the present invention is the imaging panel in which the first pixel circuit includes a fourth switch.

The fourth switch includes a first terminal electrically connected to the fourth conductive film and a second terminal electrically connected to the first terminal of the first switch.

Accordingly, the potential of the node can be initialized regardless of the conduction state of the first switch. Alternatively, an operation can be performed at high speed. Alternatively, noise can be reduced. As a result, a novel imaging panel that is highly convenient or reliable can be provided.

(4) Another embodiment of the present invention is the imaging panel in which the first pixel includes the photoelectric conversion element.

(5) Another embodiment of the present invention is the imaging panel in which the imaging region includes a second pixel.

The second pixel includes a second pixel circuit and the second pixel supplies a second image signal. The first conductive film is supplied with the second image signal.

The photoelectric conversion element includes a second terminal electrically connected to the second pixel circuit.

(6) Another embodiment of the present invention is the imaging panel in which the imaging region includes a group of pixels, another group of pixels, a first wiring, a second wiring, and a third wiring.

The group of pixels are arranged in the row direction, and the group of pixels include the pixel.

The other group of pixels are arranged in the column direction intersecting the row direction, and the other group of pixels include the pixel.

The first wiring is electrically connected to the group of pixels.

The second wiring is electrically connected to the group of pixels.

The third wiring is electrically connected to the group of pixels.

The first conductive film is electrically connected to the other group of pixels.

The fifth conductive film is electrically connected to the other group of pixels.

(7) Another embodiment of the present invention is the imaging panel including a selection line driver circuit, a signal line driver circuit, and a read circuit.

The selection line driver circuit supplies a first selection signal, a second selection signal, and a third selection signal.

The signal line driver circuit supplies weight data.

The read circuit is supplied with the first image signal, and the read circuit supplies image data.

The first wiring is supplied with the first selection signal, the second wiring is supplied with the second selection signal, the third wiring is supplied with the third selection signal, and the fifth conductive film is supplied with the weight data.

The first switch operates on the basis of the first selection signal, the second switch operates on the basis of the second selection signal, and the third switch operates on the basis of the third selection signal.

Accordingly, an image can be recorded. As a result, a novel imaging panel that is highly convenient or reliable can be provided.

(8) Another embodiment of the present invention is an imaging device including a light source, the imaging panel, and a control portion.

The light source emits pulsed light on the basis of a control signal, and the imaging panel performs imaging on the basis of the control signal.

The control portion is supplied with control information and image data, the control portion supplies the control signal on the basis of the control information, and the control portion supplies image information on the basis of the image data.

Accordingly, the time from light emission to imaging can be recorded. Alternatively, the distance from the imaging device to a subject can be measured. As a result, a novel imaging device that is highly convenient or reliable can be provided.

Although the block diagram in which components are classified by their functions and shown as independent blocks is shown in the drawings attached to this specification, it is difficult to completely divide actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above-described semiconductor film. Similarly, a drain of a transistor means a drain region that is part of the above-described semiconductor film or a drain electrode connected to the semiconductor film. Moreover, a gate means a gate electrode.

In this specification, a state where transistors are connected in series means, for example, a state where only one of a source and a drain of a first transistor is connected to only one of a source and a drain of a second transistor. In addition, a state where transistors are connected in parallel means a state where one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state where a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel imaging panel that is highly convenient or reliable can be provided. A novel imaging device that is highly convenient or reliable can be provided. A novel imaging panel, a novel imaging device, or a novel semiconductor device can be provided.

Note that the description of these effects does not preclude the existence of other effects. One embodiment of the present invention does not necessarily need to have all these effects. Other effects are apparent from the description of the specification, the drawings, the claims, and the like, and other effects can be derived from the description of the specification, the drawings, the claims, and the like.

BRIEF DESCRIPTION OF THE DRAWINGS

FIGS. 15A1 to 15B3 Perspective views of a package and a module each including an imaging device.

MODE FOR CARRYING OUT THE INVENTION

Figure 1:
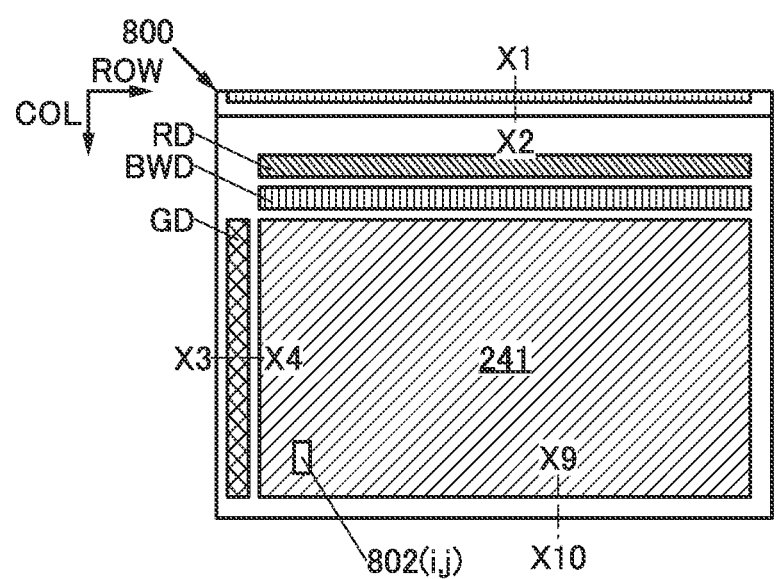
FIG. 1 A top view illustrating a structure of an imaging panel according to an embodiment.

An imaging panel of one embodiment of the present invention includes an imaging region, and the imaging region includes a photoelectric conversion element, a pixel, a first conductive film, a second conductive film, a third conductive film, a fourth conductive film, and a fifth conductive film. The pixel includes a pixel circuit and supplies an image signal. The first conductive film is supplied with the image signal and the photoelectric conversion element includes a first terminal electrically connected to the second conductive film and a second terminal electrically connected to the pixel circuit. The pixel circuit includes a first switch, a second switch, a third switch, a transistor, and a capacitor. The first switch includes a first terminal electrically connected to the second terminal of the photoelectric conversion element and a second terminal electrically connected to a node. The transistor includes a gate electrode electrically connected to the node and a first electrode electrically connected to the third conductive film. The second switch includes a first terminal electrically connected to a second electrode of the transistor and a second terminal electrically connected to the first conductive film. The third switch includes a first terminal electrically connected to the fourth conductive film and a second terminal electrically connected to the node. The capacitor includes a first electrode electrically connected to the node and a second electrode electrically connected to the fifth conductive film.

Accordingly, the potential of the node can be changed in accordance with the amount of light exposure. Alternatively, the amount of light exposure can be recorded in the node. Alternatively, the potential of the node can be changed using the potential of the fifth conductive film. Alternatively, the potential of the fifth conductive film can be added to the potential of the node. Alternatively, arithmetic operation can be performed in the pixel. As a result, a novel imaging panel that is highly convenient or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, a structure of an imaging panel of one embodiment of the present invention will be described with reference to FIG. 1 to FIG. 3, FIG. 5, and FIG. 6.

FIG. 1 is a top view illustrating a structure of the imaging panel of one embodiment of the present invention.

Figure 2A:
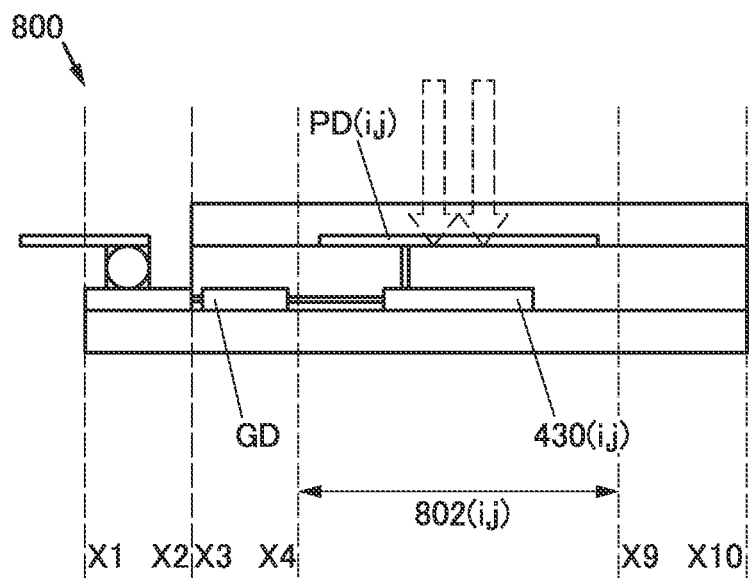
FIGS. 2A and 2B A cross-sectional view and a circuit diagram illustrating a structure of an imaging panel according to an embodiment.
Figure 2B:
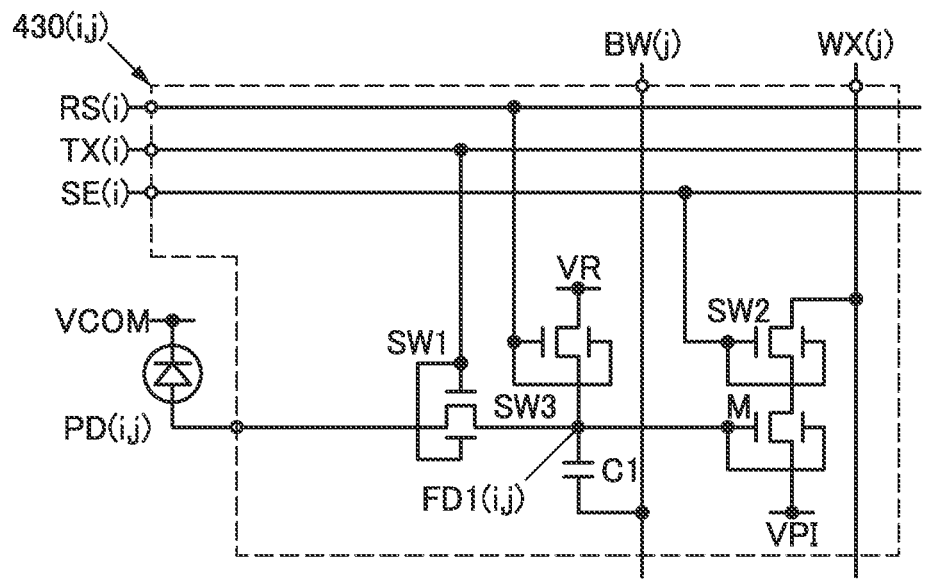

FIG. 2 is a diagram illustrating a structure of the imaging panel of one embodiment of the present invention. FIG. 2(A) is a cross-sectional view of the imaging panel of one embodiment of the present invention, and FIG. 2(B) is a circuit diagram illustrating a structure of a pixel.

Figure 3:
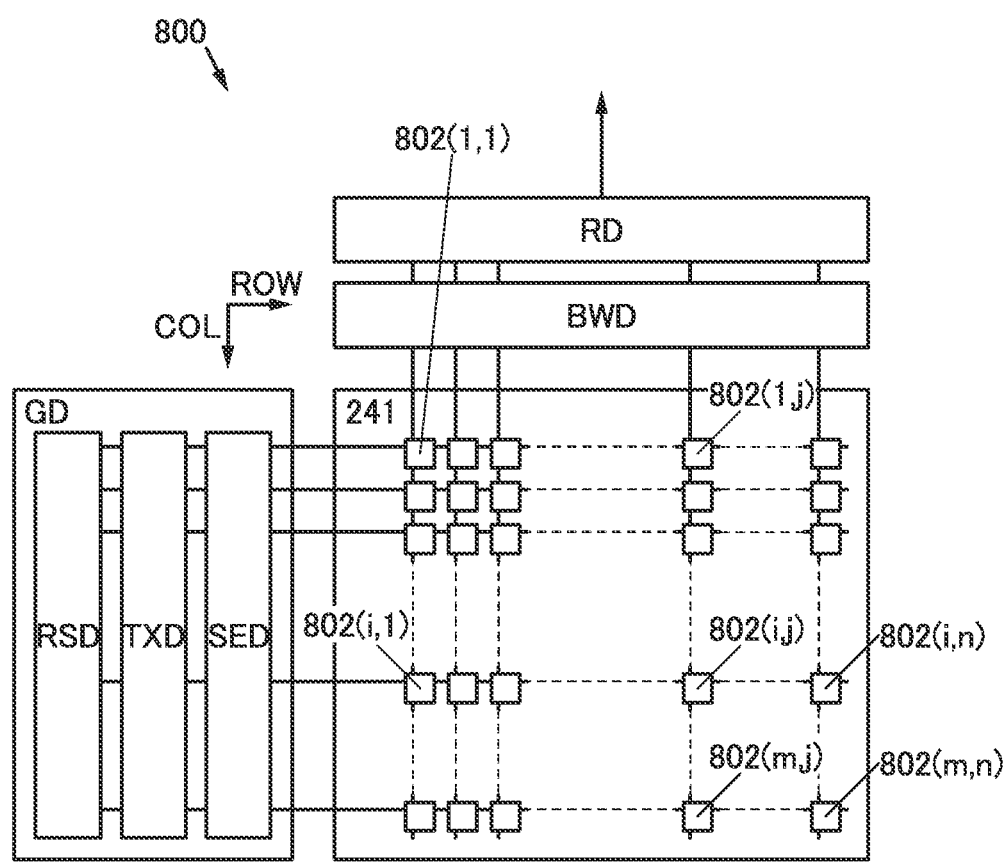
FIG. 3 A block diagram illustrating a structure of an imaging panel according to an embodiment.

FIG. 3 is a block diagram illustrating a structure of the imaging panel of one embodiment of the present invention.

Figure 5:
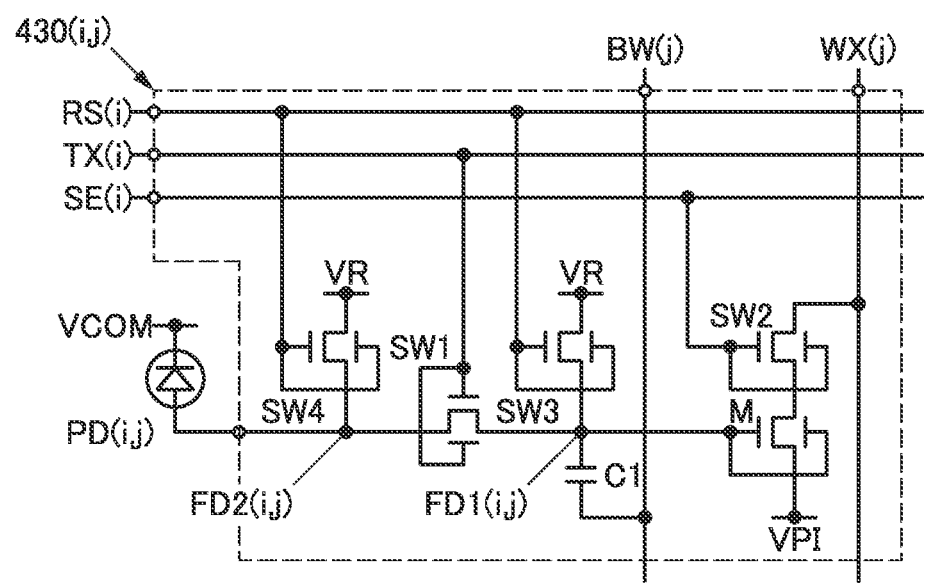
FIG. 5 A circuit diagram illustrating a structure of an imaging panel according to an embodiment.

FIG. 5 is a circuit diagram illustrating a structure of the imaging panel of one embodiment of the present invention.

Figure 6:
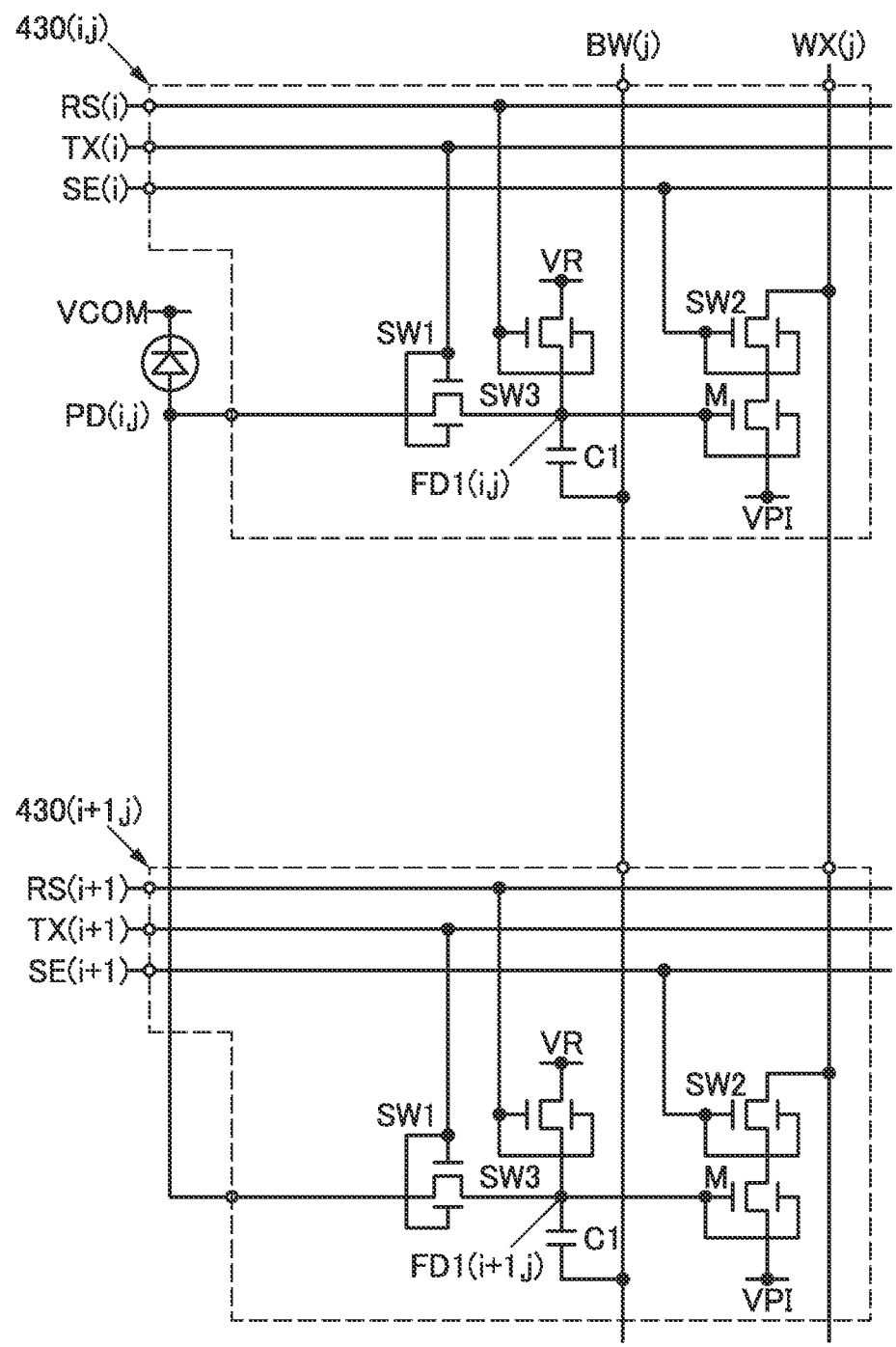
FIG. 6 A circuit diagram illustrating a structure of an imaging panel according to an embodiment.

FIG. 6 is a circuit diagram illustrating a structure of the imaging panel of one embodiment of the present invention.

Note that in this specification, an integer variable of 1 or more is sometimes used in reference numerals. For example, "(p)" where p is an integer variable of 1 or more is sometimes used in part of a reference numeral that specifies any of p components at a maximum. For another example, "(m,n)" where m and n are each an integer variable of 1 or more is sometimes used in part of a reference numeral that specifies any of m×n components at a maximum.

Structure Example 1 of Imaging Panel

An imaging panel 800 described in this embodiment includes an imaging region 241 (see FIG. 1).

Structure Example 1 of Imaging Region 241

The imaging region 241 includes a photoelectric conversion element PD(i,j) and a pixel 802(i,j) (see FIG. 1 and FIG. 2(A)). The imaging region 241 includes a conductive film WX(j), a conductive film VCOM, a conductive film VPI, a conductive film VR, and a conductive film BW(j) (see FIG. 2(B)).

Structure Example 1 of Pixel 802(i,j)

The pixel 802(i,j) includes a pixel circuit 430(i,j) (see FIG. 2(A)).

The pixel 802(i,j) supplies a first image signal, and the conductive film WX(j) is supplied with the first image signal (see FIG. 2(B)).

<<Photoelectric Conversion Element PD(i,j)>>

The photoelectric conversion element PD(i,j) includes a first terminal electrically connected to the conductive film VCOM and a second terminal electrically connected to the pixel circuit 430(i,j).

Structure Example 1 of Pixel Circuit 430(i,j)

The pixel circuit 430(i,j) includes a switch SW1, a switch SW2, a switch SW3, a transistor M, and a capacitor C1.

The switch SW1 includes a first terminal electrically connected to the second terminal of the photoelectric conversion element PD(i,j) and a second terminal electrically connected to a node FD1(i,j).

The transistor M includes a gate electrode electrically connected to the node FD1(i,j) and a first electrode electrically connected to the conductive film VPI.

The switch SW2 includes a first terminal electrically connected to a second electrode of the transistor M and a second terminal electrically connected to the conductive film WX(j).

The switch SW3 includes a first terminal electrically connected to the conductive film VR and a second terminal electrically connected to the node FD1(i,j).

The capacitor C1 includes a first electrode electrically connected to the node FD1(i,j) and a second electrode electrically connected to the conductive film BW(j).

Accordingly, the potential of the node FD1(i,j) can be changed in accordance with the amount of light exposure. Alternatively, the amount of light exposure can be recorded in the node FD1(i,j). Alternatively, the potential of the node FD1(i,j) can be changed using the potential of the conductive film BW(j). Alternatively, the potential of the conductive film BW(j) can be added to the potential of the node FD1(i,j). Alternatively, arithmetic operation can be performed in the pixel 802(i,j). As a result, a novel imaging panel that is highly convenient or reliable can be provided.

Structure Example 1 of Switch SW1 and Switch SW2

The switch SW1 includes a first transistor, and the first transistor includes an oxide semiconductor.

The switch SW2 includes a second transistor, and the second transistor includes an oxide semiconductor.

Accordingly, a current flowing through the switch SW1 and the switch SW2 that are in a non-conduction state can be lower than that of a transistor using silicon as a semiconductor. Alternatively, the retention time of the potential of the node FD1(i,j) can be long. As a result, a novel imaging panel that is highly convenient or reliable can be provided.

Structure Example 2 of Pixel Circuit 430(i,j)

The pixel circuit 430(i,j) further includes a switch SW4 (see FIG. 5).

The switch SW4 includes a first terminal electrically connected to the conductive film VR and a second terminal electrically connected to the first terminal of the switch SW1. Note that the second terminal is electrically connected to the first terminal of the switch SW1 at a node FD2(i,j).

Accordingly, the potential of the node FD2(i,j) can be initialized regardless of the conduction state of the switch SW1. Alternatively, an operation can be performed at high speed. Alternatively, noise can be reduced. As a result, a novel imaging panel that is highly convenient or reliable can be provided.

Structure Example 2 of Pixel 802(i,j)

The pixel 802(i,j) further includes the photoelectric conversion element PD(i,j). In other words, each pixel includes a photoelectric conversion element.

Structure Example 2 of Imaging Region 241

The imaging region 241 further includes a pixel 802(i+1,j).

Structure Example 3 of Pixel 802(i+1,j)

The pixel 802(i+1,j) includes a pixel circuit 430(i+1,j).

The pixel 802(i+1,j) supplies a second image signal, and the conductive film WX(j) is supplied with the second image signal.

<<Photoelectric Conversion Element PD(j)>>

The photoelectric conversion element PD(i,j) includes a second terminal electrically connected to the pixel circuit 430(i+1,j) (see FIG. 6). In other words, one photoelectric conversion element is shared by a plurality of pixels. This can increase the light-receiving area of the photoelectric conversion element PD(i,j). Alternatively, a change in light that enters one photoelectric conversion element PD(i,j) can be recorded using two pixel circuits. Alternatively, in two periods, light that enters one photoelectric conversion element PD(i,j) can be recorded using two pixel circuits.

Structure Example 3 of Pixel Circuit 430(i,j)

Another structure of the imaging panel of one embodiment of the present invention is described with reference to FIG. 7.

Figure 7:
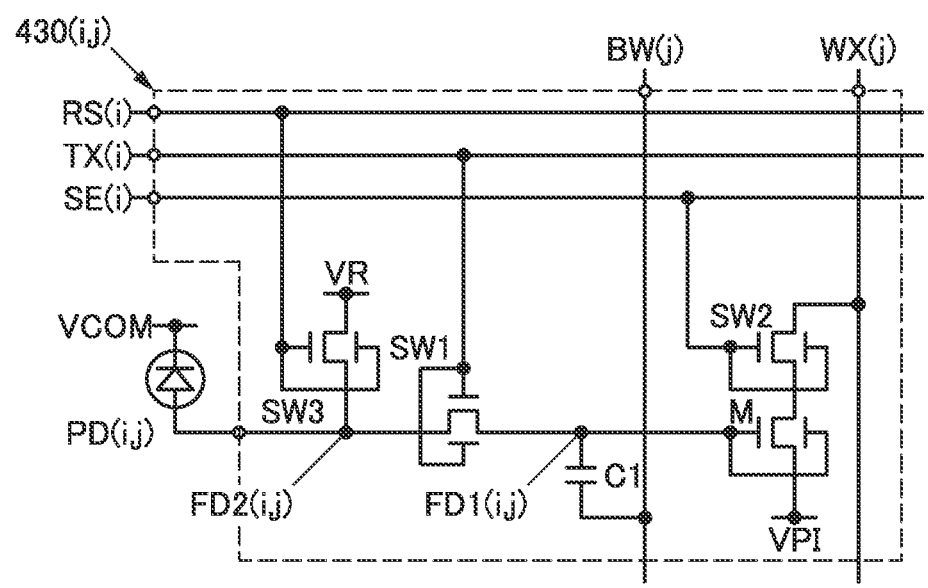
FIG. 7 A circuit diagram illustrating a structure of an imaging panel according to an embodiment.

FIG. 7 is a circuit diagram illustrating a structure of the imaging panel of one embodiment of the present invention.

Note that the pixel circuit 430(i,j) of the imaging panel described with reference to FIG. 7 is different from that of the imaging panel described with reference to FIG. 2(B) in that the switch SW3 includes a second terminal electrically connected to the first terminal of the switch SW1.

Accordingly, even in the case where a dark current flows through the photoelectric conversion element PD(i,j), the potential of the node FD2(i,j) can be initialized. Alternatively, variation in the potential of the node FD2(i,j) can be suppressed. As a result, a novel imaging panel that is highly convenient or reliable can be provided.

Structure Example 3 of Imaging Region 241

The imaging region 241 further includes a group of pixels 802(1,j) to 802(m,j) and another group of pixels 802(i,1) to 802(i,n) (see FIG. 3). In addition, a wiring TX(i), a wiring SE(i), and a wiring RS(i) are included (see FIG. 2(B)).

The group of pixels 802(i,1) to 802(i,n) are arranged in the row direction (the direction indicated by the arrow ROW in the drawing) and include the pixel 802(i,j).

The group of pixels 802(1,j) to 802(m,j) are arranged in the column direction (the direction indicated by the arrow COL in the drawing) and include the pixel 802(i,j).

Structure Example of Wiring TX(i)

The wiring TX(i) is electrically connected to the group of pixels 802(i,1) to 802(i,n) arranged in the row direction.

Structure Example of Wiring SE(i)

The wiring SE(i) is electrically connected to the group of pixels 802(i,1) to 802(i,n) arranged in the row direction.

Structure Example of Wiring RS(i)

The wiring RS(i) is electrically connected to the group of pixels 802(i,1) to 802(i,n) arranged in the row direction.

Structure Example of Conductive Film WX(j)

The conductive film WX(j) is electrically connected to the group of pixels 802(1,j) to 802(m, j) arranged in the column direction.

<<Structure of Conductive Film BW(j)>>

The conductive film BW( ) is electrically connected to the group of pixels 802(1,j) to 802(m, j) arranged in the column direction.

Accordingly, an image can be recorded. As a result, a novel imaging panel that is highly convenient or reliable can be provided.

Structure Example 4 of Imaging Region 241

Another structure of the imaging panel of one embodiment of the present invention is described with reference to FIG. 8.

Figure 8A:
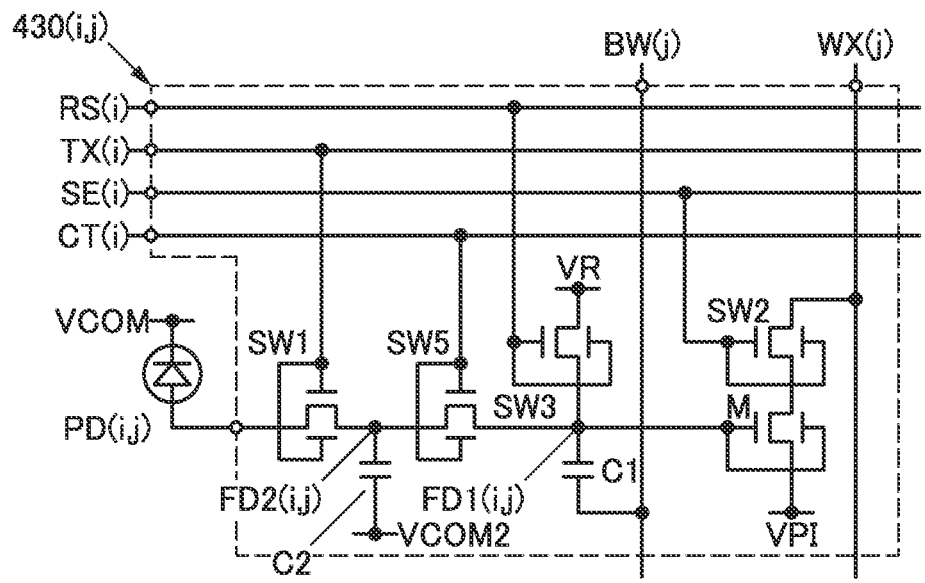
FIGS. 8A and 8B A circuit diagram illustrating a structure of an imaging device according to an embodiment and a timing chart showing a method for driving the imaging device.
Figure 8B:
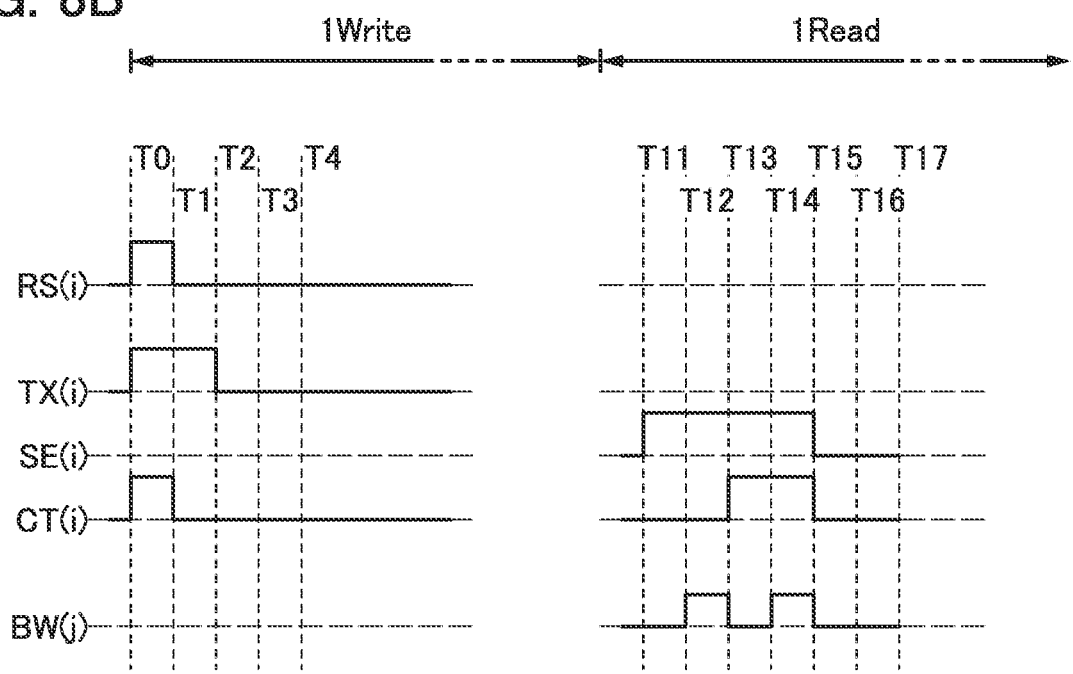

FIG. 8 is a diagram illustrating a structure of the imaging panel of one embodiment of the present invention. FIG. 8(A) is a circuit diagram illustrating a structure of the pixel circuit of the imaging panel of one embodiment of the present invention, and FIG. 8(B) is a timing chart showing a method for driving the imaging panel described with reference to FIG. 8(A).

Note that the imaging panel described with reference to FIG. 8 is different from the imaging panel described with reference to FIG. 2(B) in that the pixel circuit 430(i,j) includes a switch SW5, the pixel circuit 430(i,j) includes a capacitor C2, and the imaging region 241 includes a wiring CT(i). Different portions will be described in detail here, and refer to the above description for portions that can use similar structures.

Structure Example of Pixel Circuit 430(i,j)

The switch SW5 includes a first terminal electrically connected to the node FDT(i,j) (see FIG. 8).

The switch SW1 includes a second terminal electrically connected to a second terminal of the switch SW5.

The capacitor C2 includes a first electrode electrically connected to a conductive film VCOM2 and a second electrode electrically connected to the second terminal of the switch SW5.

Note that the conductive film VCOM2 can supply a ground potential, for example.

Structure Example of Wiring CT(i)

The wiring CT(i) is electrically connected to the group of pixels 802(i,1) to 802(i,n) arranged in the row direction.

Accordingly, noise generated when the node FD(i,j) is initialized using the switch SW3 can be canceled out. Alternatively, information with weight proportional to the value of the product of the amount of light exposure EXP(i,j) of the pixel 802(i,j) and weight data W(i,j) can be obtained using a read circuit including a two-stage correlated double sampling circuit. As a result, a novel imaging panel that is highly convenient or reliable can be provided.

Note that this embodiment can be combined with other embodiments in this specification as appropriate.

Embodiment 2

In this embodiment, a structure of the imaging panel of one embodiment of the present invention will be described with reference to FIG. 3 and FIG. 4.

Figure 4A:
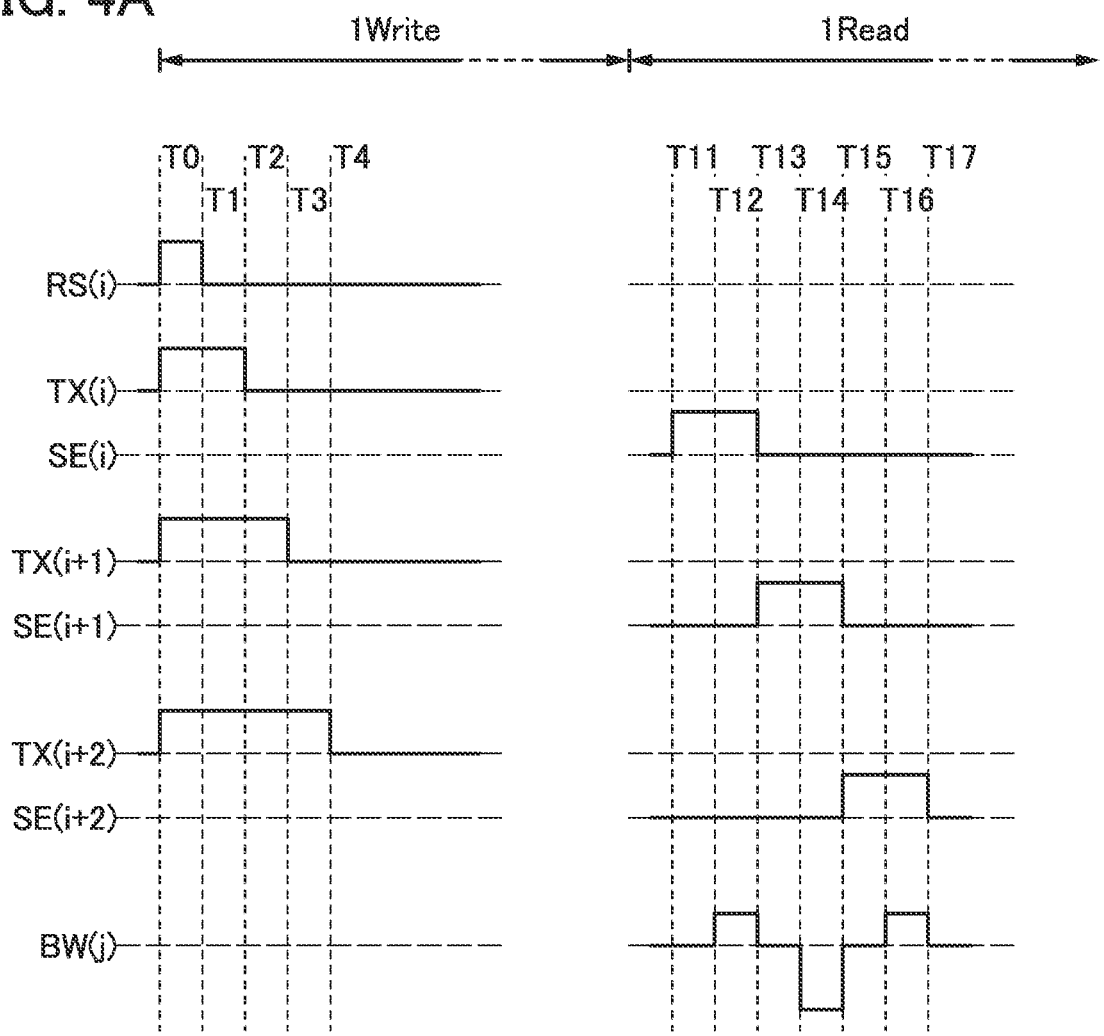
FIGS. 4A and 4B Timing charts showing a method for driving an imaging panel according to an embodiment.
Figure 4B:
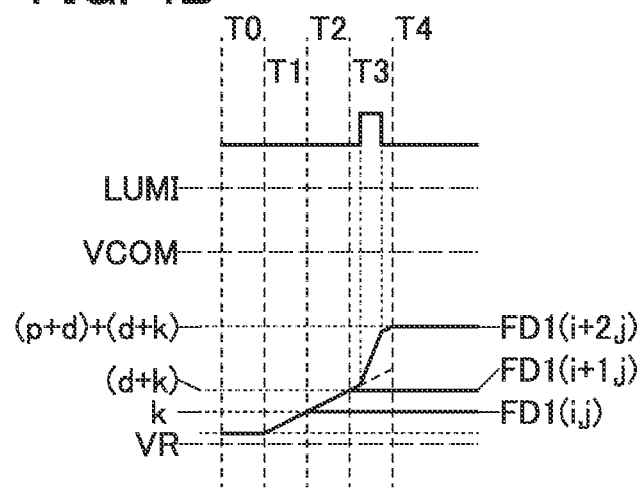

FIG. 4 is a diagram showing a method for driving the imaging panel of one embodiment of the present invention. FIG. 4(A) is a timing chart showing a method for driving the imaging panel of one embodiment of the present invention, and FIG. 4(B) is a timing chart showing a change in the potential of the node included in the pixel of the imaging panel of one embodiment of the present invention.

Structure Example 1 of Imaging Panel

The imaging panel 800 described in this embodiment includes the selection line driver circuit GD, a signal line driver circuit BWD, and a read circuit RD (see FIG. 3).

Structure Example of Selection Line Driver Circuit GD

The selection line driver circuit GD includes a driver circuit RSD, a driver circuit TXD, and a driver circuit SED, and has a function of supplying a first selection signal, a second selection signal, and a third selection signal.

Structure Example of Signal Line Driver Circuit BWD

The signal line driver circuit BWD supplies weight data.

Structure Example of Read Circuit RD

The read circuit RD is supplied with the first image signal, and the read circuit RD supplies image data.

Structure Example of Wiring TX(i)

The wiring TX(i) is supplied with the first selection signal.

Structure Example of Wiring SE(i)

The wiring SE(i) is supplied with the second selection signal.

Structure Example of Wiring RS(i)

The wiring RS(i) is supplied with the third selection signal.

<<Structure of conductive film BW(j)>>

The conductive film BW(j) is supplied with the weight data.

Structure Example of Switch SW1

The switch SW1 operates on the basis of the first selection signal.

Structure Example of Switch SW2

The switch SW2 operates on the basis of the second selection signal.

Structure Example of Switch SW3

The switch SW3 operates on the basis of the third selection signal.

Accordingly, an image can be recorded. As a result, a novel imaging panel that is highly convenient or reliable can be provided.

<Driving Method 1 of Imaging Panel 800>

A method for recording the amount of light exposure EXP(i,j) to the amount of light exposure EXP(i+2j) by using the imaging panel 800 will be described (see FIG. 4). Note that a period for recording is shown in FIG. 4(A) with a reference numeral "1Write".

[First Step]

In a first step, the pixel 802($i,j$) is initialized.

For example, in Period T0, the wiring RS(i) supplies a potential for bringing the switch SW3 of the pixel 802($i,j$) into a conduction state, and the potential of the node FD1($i,j$) is initialized using a potential supplied by the conductive film VR (see FIG. 4(B)).

[Second Step]

In a second step, the amount of light exposure EXP(i,j) in Period T1 is recorded in the pixel 802($i,j$).

For example, in Period T1, the wiring TX(i) supplies a potential for bringing the switch SW1 of the pixel 802($i,j$) into a non-conduction state (see FIG. 4(A)). The photoelectric conversion element PD(i,j) flows a current depending on the amount of light exposure EXP(i,j), and the potential of the node FD1($i,j$) increases.

Specifically, the node FD1($i,j$) retains a potential higher than a potential r supplied by the conductive film VR by a voltage x (see FIG. 4(B)). Note that, for example, the voltage x includes a component derived from steady ambient light, and is denoted by k in the drawing.

Note that in Period T1, when light enters the pixel 802($i,j$), the light also enters the pixel 802($i$+1,j), and both of the two pixels record the amount of light exposure derived from the light.

[Third Step]

In a third step, the amount of light exposure EXP(i+1,j) in Period T1 and Period T2 is recorded in the pixel 802($i$+1,j). Note that Period T2 can be sufficiently shorter than Period T0. Furthermore, rise of a signal supplied to the wiring TX(i+1) does not necessarily coincide with rise of a signal supplied to the wiring TX(i). For example, the rise of the signal supplied to the wiring TX(i+1) can be delayed as compared to the rise of the signal supplied to the wiring TX(i). Specifically, the delay can be a period shorter than 10 ns. Alternatively, the width of a pulsed signal supplied to the wiring TX(i+1) can be equal to the width of a pulsed signal supplied to the wiring TX(i+1).

For example, in Period T2, the wiring TX(i+1) supplies a potential for bringing the switch SW1 of the pixel 802($i$+1,j) into a non-conduction state (see FIG. 4(A)). The photoelectric conversion element PD(i+1,j) flows a current depending on the amount of light exposure EXP(i+1,j), and the potential of the node FD1(+1 j) increases.

Specifically, the node FD1($i$+1,j) retains a potential higher than the potential r supplied by the conductive film VR by a voltage (x+d) (see FIG. 4(B)). Note that, for example, the voltage d is a component derived from steady ambient light.

Note that Period T2 is preferably shorter than or equal to 10 ns. Light travels at approximately 3 m for 10 ns. Furthermore, when light enters the pixel 802($i$+1,j) in Period T2, the pixel 802($i$+1,j) records the light and the pixel 802($i,j$) does not record the light.

In such a manner, the distance from the imaging panel to a subject within 3 m from the imaging panel can be calculated.

[Fourth Step]

In a fourth step, the amount of light exposure EXP(i+2j) from Period T1 to Period T3 is recorded in the pixel 802($i$+2j).

For example, in Period T3, the wiring TX(i+2) supplies a potential for bringing the switch SW1 of the pixel 802($i$+2j) into a non-conduction state (see FIG. 4(A)). The photoelectric conversion element PD(i+2j) flows a current depending on the amount of light exposure EXP(i+2j), and the potential of the node FD1($i$+2j) increases.

Specifically, the node FD1($i$+2j) retains a potential higher than the potential r supplied by the conductive film VR by a voltage (x+2d+p) (see FIG. 4(B)). For example, the voltage 2d is a component derived from steady ambient light that enters in Period T2 and Period T3, and the voltage p is a component derived from pulsed light that enters in Period T3. Note that FIG. 4(B) shows the amount of light LUMI that enters from Period T0 to Period T4.

Accordingly, the pixel 802($i,j$) records the amount of light exposure EXP(i,j) in Period T1, the pixel 802($i$+1,j) records the amount of light exposure EXP(i+1,j) in Period T2, and the pixel 802($i$+2j) records the amount of light exposure EXP(i+2j) in Period T3.

<Driving Method 2 of Imaging Panel 800>

A method for obtaining information with weight proportional to the value of the product of the amount of light exposure EXP(i,j) of the pixel 802(*i,j*) and the weight data W(i,j) from a current flowing through the conductive film WX(j) is described.

Specifically, a method for obtaining the information with weight by using the amount of change $I_{dif}$(i,j,w) derived from presence or absence of the weight data W(i,j) of the current flowing through the conductive film WX(j) is described. Note that a period for obtaining the information with weight is shown in FIG. 4(A) with a reference numeral "1Read".

[First Step]

In a first step, a current I(i,j,0) flowing through the conductive film WX(j) in the case where the weight data W(i,j) is not used is measured.

For example, in Period T11, a potential for bringing the switch SW2 into a conduction state is supplied by using the wiring SE(i), and a reference potential is supplied to the capacitor C1 by using the conductive film BW(j) (see FIG. 4(A)). In such a manner, a state where the weight data W(i,j) is not added can be made.

Furthermore, the current I(i,j,0) flowing from the conductive film WX(j) to the conductive film VPI is measured using the read circuit RD (see FIG. 2(B) and FIG. 3). That is, the first image signal is read out using the read circuit RD.

The current I(i,j,0) flowing through the conductive film WX(j) is proportional to a function expressed by Formula (1) below, for example. Note that in the formula, r+x represents the potential of the node FD1(*i,j*) in Period T11 and $V_{th}$ represents the threshold value of the transistor M.

[Formula 1]

$$(r+x-Vth)^2 \qquad (1)$$

[Second Step]

In a second step, a current I(i,j,w) flowing through the conductive film WX(j) in the case where the weight data W(i,j) is used is measured.

For example, in Period T12, a potential for bringing the switch SW2 into a conduction state is supplied using the wiring SE(i), and voltage including the weight data W(i,j) is supplied using the conductive film BW(j) (see FIG. 4(A)).

Furthermore, the current I(i,j,w) flowing from the conductive film WX(j) to the conductive film VPI is measured using the read circuit RD (see FIG. 2(B) and FIG. 3).

The current I(i,j,w) flowing through the conductive film WX(j) is proportional to a function expressed by Formula (2) below, for example. Note that in the formula, r+x represents the potential of the node FD1(*i,j*) in Period T11, w represents voltage including the weight data W(i,j), and Vth represents the threshold value of the transistor M.

[Formula 2]

$$(r+x+w-Vth)^2 \qquad (2)$$

[Third Step]

In a third step, the amount of change $I_{dif}$(i,j,w) derived from presence or absence of the weight data W(i,j) of the current flowing through the conductive film WX(j) is obtained.

For example, the amount of change $I_{dif}$(i,j,w) derived from presence or absence of the weight data W(i,j) of the current flowing through the conductive film WX(j) is obtained by subtracting the current I(i,j,w) from the current I(i,j,0) using a differential circuit.

Note that the amount of change $I_{dif}$(i,j,w) derived from presence or absence of the weight data W(i,j) of the current flowing through the conductive film WX(j) is proportional to a function expressed by Formula (3) below.

[Formula 3]

$$(r+x-Vth)^2 - (r+x+w-Vth)^2 = \qquad (3)$$
$$(r+x-Vth+r+x+w-Vth)(r+x-Vth-r-x-w+Vth) =$$
$$-w(2r+2x+w-2Vth)$$

[Fourth Step]

In a fourth step, the amount of change $I_{dif0}$(i,j,w) in the case where light exposure is not performed is subtracted from the amount of change $I_{dif}$(i,j,w) obtained in the third step, whereby $I_{DELTA}$(i,j,w) is calculated.

Note that the amount of change derived from presence or absence of the weight data W(i,j) of the current flowing through the conductive film WX(j) of a pixel not exposed to light can be used as the amount of change $I_{dif0}$(i,j,w) in the case where light exposure is not performed.

Specifically, the amount of change $I_{dif0}$(i,j,w) is subtracted from the amount of change $I_{dif}$(i,j,w) by using an arithmetic device.

Note that the amount of change $I_{dif0}$(i,j,w) in the case where light exposure is not performed is proportional to a function expressed by Formula (4) below.

[Formula 4]

$$(r-Vth)^2 - (r+w-Vth)^2 = \qquad (4)$$
$$(r-Vth+r+w-Vth)(r-Vth-r-w+Vth) = -w(2r+w-2Vth)$$

In addition, $I_{DELTA}$(i,j,w) is proportional to a function expressed by Formula (5) below. Note that in the formula, r+x represents the potential of the node FD1(*i,j*) in Period T11 and w represents voltage including the weight data W(i,j).

[Formula 5]

$$-w(2r+2x+w-2Vth) + w(2r+w-2Vth) = -2wx \qquad (5)$$

Accordingly, the information with weight proportional to the value of the product of the amount of light exposure EXP(i,j) of the pixel 802(*i,j*) and weight data W(i,j) can be obtained from the arithmetic operation results.

<Driving Method 3 of Imaging Panel 800>

A method for subtracting a component derived from steady light that enters the imaging panel 800 is described. For example, components derived from steady light that enters those pixels can be subtracted using the pixel 802(*i,j*), the pixel 802(*i*+1,j), and the pixel 802(*i*+2j).

Note that the pixel 802(*i,j*) records light that enters in Period T1, the pixel 802(*i*+1,j) records light that enters in Period T1 and Period T2, and the pixel 802(*i*+2j) records light that enters from Period T1 to Period T3.

[First Step]

In a first step, for example, $I_{DELTA}$(i,j,w) of the pixel 802(*i,j*) is calculated using an arithmetic device.

Specifically, using w as the weight data W(i,j), $I_{DELTA}$(i,j,−w) is calculated by subtracting the amount of change $I_{dif0}(i,j,-w)$ from the amount of change $I_{dif}(i,j,w)$. Note that $I_{DELTA}(i,j,-w)$ is proportional to a value w(r+x) which is obtained by multiplying (r+x) by w.

[Second Step]

In a second step, for example, $I_{DELTA}(i+1,j,w)$ of the pixel 802(i+1,j) is calculated using an arithmetic device.

Specifically, using −2w as the weight data W(i+1,j), $I_{DELTA}(i+1,j,-2w)$ is calculated by subtracting the amount of change $I_{dif0}(i+1,j,-2w)$ from the amount of change $I_{dif}(i+1,j,-2w)$. Note that $I_{DELTA}(i+1,j,-2w)$ is proportional to a value −2w(r+x+d) which is obtained by multiplying (r+x+d) by −2w.

[Third Step]

In a third step, for example, $I_{DELTA}(i+2,j,w)$ of the pixel 802(i+2j) is calculated using an arithmetic device.

Specifically, using w as the weight data W(i+2,j), $I_{DELTA}(i+2,j,w)$ is calculated by subtracting the amount of change $I_{dif0}(i+2,j,w)$ from the amount of change $I_{dif}(i+2,j,w)$. Note that $I_{DELTA}(i+2j,w)$ is proportional to a value w(r+x+2d+p) which is obtained by multiplying (r+x+2d+p) by w.

[Fourth Step]

In a fourth step, for example, the value of the sum SUM of $I_{DELTA}(i,j,-w)$, $I_{DELTA}(i+1,j,-2w)$, and $I_{DELTA}(i+2,j,w)$ calculated in the first step to the third step is calculated using an arithmetic device. Note that the value of the sum SUM is proportional to a value obtained by multiplying p by w.

[Formula 6]

$$w(r+x) - 2w(r+x+d) + w(r+x+2d+p) = \\ w(r+x-2r-2x-2d+r+x+2d+p) = wp \quad (6)$$

In such a manner, a component derived from steady light is subtracted from light that enters in a predetermined period, and thus a residual component can be extracted. Alternatively, a component derived from steady light is subtracted from light that enters in a predetermined period, and thus a component of pulsed light can be extracted, for example.

<Driving Method 4 of Imaging Panel 800>

A method for driving the imaging panel described with reference to FIG. 8(A) will be described (see FIG. 8(B)). Note that a period for recording is shown in FIG. 8(B) with a reference numeral "1Write". A period for obtaining information with weight is shown in FIG. 8(B) with a reference numeral "1Read".

[First Step]

In a first step, the pixel 802(i,j) is initialized.

For example, in Period T0, the wiring RS(i) supplies a potential for bringing the switch SW3 into a conduction state, and the wiring CT(i) supplies a potential for bringing the switch SW5 into a conduction state. Accordingly, the potential of the node FD1(i,j) and the potential of the node FD2(i,j) are initialized using a potential supplied by the conductive film VR.

[Second Step]

In a second step, the amount of light exposure EXP(i,j) in Period T1 is recorded in the pixel 802(i,j).

For example, in Period T1, the wiring TX(i) supplies a potential for bringing the switch SW1 of the pixel 802(i,j) into a non-conduction state (see FIG. 8(B)). The photoelectric conversion element PD(i,j) flows a current depending on the amount of light exposure EXP(i,j), and the potential of the node FD2(i,j) increases.

Specifically, the node FD2(i,j) retains a potential higher than the potential r supplied by the conductive film VR by the voltage x.

[Third Step]

In a third step, the current I(i,j,0) flowing through the conductive film WX(j) in the case where there is no influence of light exposure and the weight data W(i,j) is not used is measured.

For example, in Period T11, a potential for bringing the switch SW2 into a conduction state is supplied by using the wiring SE(i), and a reference potential is supplied to the capacitor C1 by using the conductive film BW( ) (see FIG. 8(B)). In such a manner, a state where the weight data W(i,j) is not added can be made.

In addition, a potential for keeping the switch SW5 in a non-conduction state is supplied using the wiring CT(i). Accordingly, the influence of light exposure on the potential of the node FD1(i,j) can be eliminated.

Furthermore, the current I(i,j,0) flowing from the conductive film WX(j) to the conductive film VPI is measured using the read circuit RD (see FIG. 8(A) and FIG. 3). That is, the potential of the node FD1(i,j) which is not influenced by light exposure is read out using the read circuit RD.

[Fourth Step]

In a fourth step, the current I(i,j,w) flowing through the conductive film WX(j) in the case where there is no influence of light exposure and the weight data W(i,j) is used is measured.

For example, in Period T12, a potential for bringing the switch SW2 into a conduction state is supplied using the wiring SE(i), and voltage including the weight data W(i,j) is supplied using the conductive film BW(j) (see FIG. 8(B)).

In addition, a potential for keeping the switch SW5 in a non-conduction state is supplied using the wiring CT(i). Accordingly, the influence of light exposure on the potential of the node FD1(i,j) can be eliminated.

Furthermore, the current I(i,j,w) flowing from the conductive film WX(j) to the conductive film VPI is measured using the read circuit RD (see FIG. 8(A) and FIG. 3).

[Fifth Step]

In a fifth step, the amount of change $I_{dif0}(i,j,w)$ derived from presence or absence of the weight data W(i,j) of the current flowing through the conductive film WX(j) in the case where there is no influence of light exposure is obtained.

For example, the amount of change $I_{dif0}(i,j,w)$ derived from presence or absence of the weight data W(i,j) of the current flowing through the conductive film WX(j) is obtained by subtracting the current I(i,j,w) from the current I(i,j,0) using a differential circuit.

[Sixth Step]

In a sixth step, the current I(i,j,0) flowing through the conductive film WX(j) in the case where light exposure is performed and the weight data W(i,j) is not used is measured.

For example, in Period T13, a potential for bringing the switch SW2 into a conduction state is supplied by using the wiring SE(i), and a reference potential is supplied to the capacitor C1 by using the conductive film BW(j) (see FIG. 8(B)). In such a manner, a state where the weight data W(i,j) is not added can be made.

In addition, a potential for bringing the switch SW5 into a conduction state is supplied using the wiring CT(i). Accordingly, the potential of the node FD1(i,j) can be exposed to light.

Furthermore, the current I(i,j,0) flowing from the conductive film WX(j) to the conductive film VPI is measured using the read circuit RD (see FIG. 8(A) and FIG. 3). That is, the potential of the node FD1($i,j$) exposed to light is read out using the read circuit RD.

[Seventh Step]

In a seventh step, the current I(i,j,w) flowing through the conductive film WX(j) in the case where light exposure is performed and the weight data W(i,j) is used is measured.

For example, in Period T14, a potential for bringing the switch SW2 into a conduction state is supplied using the wiring SE(i), and voltage including the weight data W(i,j) is supplied using the conductive film BW(j) (see FIG. 8(B)).

In addition, a potential for bringing the switch SW5 into a conduction state is supplied using the wiring CT(i). Accordingly, the potential of the node FD1($i,j$) can be exposed to light.

Furthermore, the current I(i,j,w) flowing from the conductive film WX(j) to the conductive film VPI is measured using the read circuit RD (see FIG. 8(A) and FIG. 3).

[Eighth Step]

In an eighth step, the amount of change $I_{dif}$(i,j,w) derived from presence or absence of the weight data W(i,j) of the current flowing through the conductive film WX(j) in the case where light exposure is performed is obtained.

For example, the amount of change $I_{dif}$(i,j,w) derived from presence or absence of the weight data W(i,j) of the current flowing through the conductive film WX(j) is obtained by subtracting the current I(i,j,w) from the current I(i,j,0) using a differential circuit.

Note that this embodiment can be combined with other embodiments in this specification as appropriate.

Embodiment 3

In this embodiment, structure examples and the like of the imaging device of one embodiment of the present invention are described.

Figure 9A:
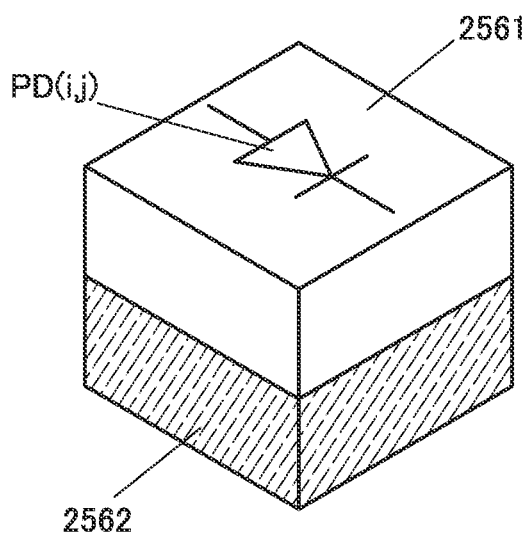
FIGS. 9A to 9E Diagrams illustrating structures of a pixel of an imaging device.
Figure 9B:
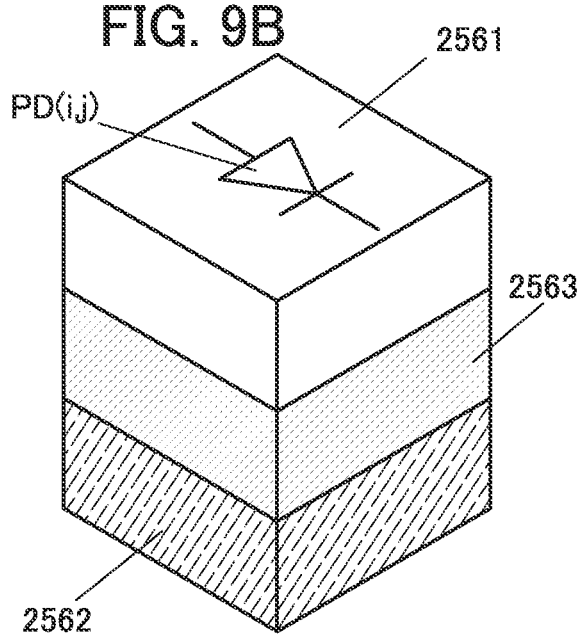

FIG. 9(A) and FIG. 9(B) illustrate structure examples of a pixel included in the imaging device. The pixel illustrated in FIG. 9(A) is an example having a stacked-layer structure of a layer 2561 and a layer 2562.

Figure 9C:
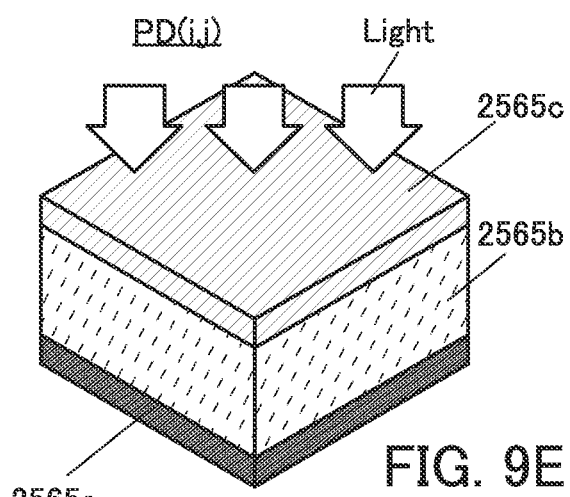

The layer 2561 includes the photoelectric conversion element PD(i,j). As illustrated in FIG. 9(C), the photoelectric conversion element PD(i,j) can be a stacked layer of a layer 2565a, a layer 2565b, and a layer 2565c.

The photoelectric conversion element PD(i,j) illustrated in FIG. 9(C) is a pn-junction photodiode; for example, a p$^+$-type semiconductor, an n-type semiconductor, and an n$^+$-type semiconductor can be used for the layer 2565a, the layer 2565b, and the layer 2565c, respectively. Alternatively, an n$^+$-type semiconductor, a p-type semiconductor, and a p$^+$-type semiconductor may be used for the layer 2565a, the layer 2565b, and the layer 2565c, respectively. Alternatively, a pin-junction photodiode in which the layer 2565b is an i-type semiconductor may be used.

The above-described pn-junction photodiode or pin-junction photodiode can be formed using single crystal silicon. Furthermore, the pin-junction photodiode can also be formed using a thin film of amorphous silicon, microcrystalline silicon, polycrystalline silicon, or the like.

Figure 9D:
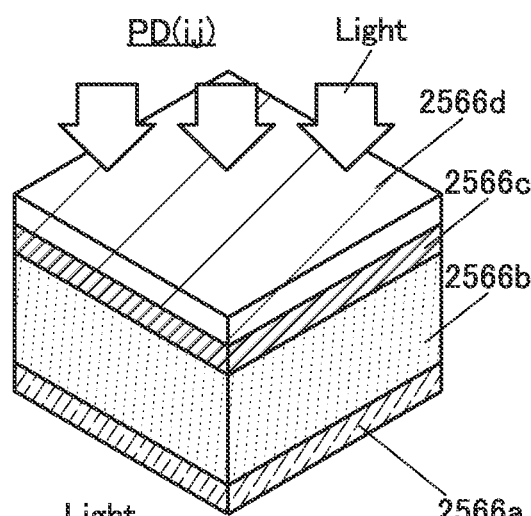

The photoelectric conversion element PD(i,j) included in the layer 2561 may be a stacked layer of a layer 2566a, a layer 2566b, a layer 2566c, and a layer 2566d as illustrated in FIG. 9(D).

The photoelectric conversion element PD(i,j) illustrated in FIG. 9(D) is an example of an avalanche photodiode, and the layer 2566a and the layer 2566d correspond to electrodes and the layers 2566b and 2566c correspond to a photoelectric conversion portion.

For the layer 2566a, a low-resistance metal layer or the like is preferably used. For example, aluminum, titanium, tungsten, tantalum, silver, or a stacked layer thereof can be used.

As the layer 2566d, a conductive layer having a high visible light-transmitting property is preferably used. For example, indium oxide, tin oxide, zinc oxide, indium tin oxide, gallium zinc oxide, indium gallium zinc oxide, graphene, or the like can be used. Note that the layer 2566d can be omitted.

The layers 2566b and 2566c of the photoelectric conversion portion can have, for example, a structure of a pn-junction photodiode with a selenium-based material for a photoelectric conversion layer. A selenium-based material, which is a p-type semiconductor, is preferably used for the layer 2566b, and gallium oxide or the like, which is an n-type semiconductor, is preferably used for the layer 2566c.

The photoelectric conversion element with a selenium-based material has a property of high external quantum efficiency with respect to visible light. In the photoelectric conversion element, the amount of amplification of electrons with respect to the amount of incident light (Light) can be increased by utilizing the avalanche multiplication. A selenium-based material has a high light-absorption coefficient, and thus has advantages in production; for example, a photoelectric conversion layer can be fabricated as a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed with a material having a wide band gap and a visible light-transmitting property. For example, zinc oxide, gallium oxide, indium oxide, tin oxide, or a mixed oxide thereof can be used. In addition, these materials also have a function of a hole injection blocking layer, and a dark current can be decreased.

Figure 9E:
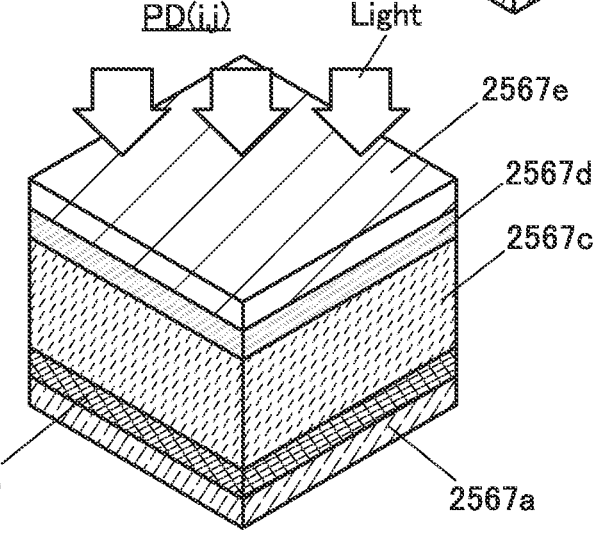

The photoelectric conversion element PD(i,j) included in the layer 2561 may be a stacked layer of a layer 2567a, a layer 2567b, a layer 2567c, a layer 2567d, and a layer 2567e as illustrated in FIG. 9(E). The photoelectric conversion element PD(i,j) illustrated in FIG. 9(D) is an example of an organic optical conductive film, and the layer 2567a and the layer 2567e correspond to electrodes and the layers 2567b, 2567c, and 2567d correspond to a photoelectric conversion portion.

One of the layers 2567b and 2567d of the photoelectric conversion portion can be a hole-transport layer, and the other can be an electron-transport layer. The layer 2567c can be a photoelectric conversion layer.

For the hole-transport layer, molybdenum oxide can be used, for example. For the electron-transport layer, fullerene such as C60 or C70 or a derivative thereof can be used, for example.

As the photoelectric conversion layer, a mixed layer of an n-type organic semiconductor and a p-type organic semiconductor (a bulk heterojunction structure) can be used.

As the layer 2562 illustrated in FIG. 9(A), a silicon substrate can be used, for example. The silicon substrate includes a Si transistor or the like. Using the Si transistor, not only a pixel circuit but also a circuit for driving the pixel circuit, a circuit for reading an image signal, an image processing circuit, and the like can be provided. Specifically, part or all of the transistors included in the pixel circuits and the peripheral circuits (such as the pixel 802(i,j), the selection line driver circuit GD, the signal line driver circuit BWD, and the read circuit RD) described in Embodiment 1 or Embodiment 2 can be provided in the layer 2562.

Furthermore, the pixel may have a stacked-layer structure of the layer 2561, a layer 2563, and the layer 2562 as illustrated in FIG. 9(B).

The layer 2563 can include OS transistors (for example, the switch SW1 and the switch SW3 of the pixel 802(i,j)). In that case, the layer 2562 may include Si transistors (for example, the transistor M and the switch SW2 of the pixel 802(i,j)). Furthermore, part of the transistors included in the peripheral circuits described in Embodiment 1 or Embodiment 2 may be provided in the layer 2563.

With such a structure, components of the pixel circuit and the peripheral circuits can be dispersed in a plurality of layers and the components can be provided to overlap with each other or any of the component and any of the peripheral circuits can be provided to overlap with each other, whereby the area of the imaging device can be reduced. Note that in the structure of FIG. 9(B), the layer 2562 may be a support substrate, and the pixel 802(i,j) and the peripheral circuits may be provided in the layer 2561 and the layer 2563.

As a semiconductor material used for the OS transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAAC-OS, a CAC-OS, or the like described later can be used. A CAAC-OS has a crystal structure including stable atoms and is suitable for a transistor that is required to have high reliability, and the like. A CAC-OS has high mobility and is suitable for a transistor that operates at high speed, and the like.

In the OS transistor, the semiconductor layer has a large energy gap, and thus the OS transistor has an extremely low off-state current of several yA/µm (current per micrometer of a channel width). An OS transistor has features such that impact ionization, an avalanche breakdown, a short-channel effect, or the like does not occur, which are different from those of a Si transistor. Thus, the use of an OS transistor enables formation of a circuit having high withstand voltage and high reliability. Moreover, variations in electrical characteristics due to crystallinity unevenness, which are caused in Si transistors, are less likely to occur in OS transistors.

The semiconductor layer of the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that forms the semiconductor layer is an In-M-Zn-based oxide, it is preferable that the atomic ratio of the metal elements of a sputtering target used to deposit the In-M-Zn oxide satisfy In≥M and Zn≥M. The atomic ratio of metal elements of such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8.

Note that the atomic ratio in the deposited semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low density of defect states and can thus be referred to as an oxide semiconductor having stable characteristics.

However, the composition is not limited to those, and a material having the appropriate composition may be used depending on required semiconductor characteristics and electrical characteristics of the transistor (field-effect mobility, threshold voltage, or the like). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to be appropriate.

When silicon or carbon, which is one of elements belonging to Group 14, is contained in the oxide semiconductor contained in the semiconductor layer, oxygen vacancies are increased, and the semiconductor layer becomes n-type. Thus, the concentration of silicon or carbon (concentration measured by secondary ion mass spectrometry) in the semiconductor layer is set to lower than or equal to $2\times10^{18}$ atoms/cm$^3$, preferably lower than or equal to $2\times10^{17}$ atoms/cm$^3$.

Alkali metal and alkaline earth metal might generate carriers when bonded to an oxide semiconductor, in which case the off-state current of the transistor might be increased. Thus, the concentration of alkali metal or alkaline earth metal (concentration measured by secondary ion mass spectrometry) in the semiconductor layer is set to lower than or equal to $1\times10^1$ atoms/cm$^3$, preferably lower than or equal to $2\times10^{16}$ atoms/cm$^3$.

When nitrogen is contained in the oxide semiconductor contained in the semiconductor layer, electrons serving as carriers are generated and the carrier density increases, so that the semiconductor layer easily becomes n-type. As a result, a transistor including an oxide semiconductor which contains nitrogen is likely to have normally-on characteristics. Hence, the concentration of nitrogen in the semiconductor layer (concentration measured by secondary ion mass spectrometry) is preferably set to lower than or equal to $5\times10^{18}$ atoms/cm$^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy in which hydrogen has entered functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively.

Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of the non-single-crystal structure include a CAAC-OS including a c-axis aligned crystal (C-Axis Aligned Crystalline Oxide Semiconductor), a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide semiconductor film having an amorphous structure has a completely amorphous structure and no crystal part, for example.

Note that the semiconductor layer may be a mixed film including two or more of a region having an amorphous structure, a region having a microcrystalline structure, a region having a polycrystalline structure, a region of the CAAC-OS, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

The CAC-OS is, for example, a composition of a material in which elements included in an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state where one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern.

Note that an oxide semiconductor preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter InO$_{X1}$ (X1 is a real number greater than 0)) or indium zinc oxide (hereinafter In$_{X2}$Zn$_{Y2}$O$_{Z2}$ (X2, Y2, and Z2 are real numbers greater than 0)) and gallium oxide (hereinafter GaO$_{X3}$ (X3 is a real number greater than 0)) or gallium zinc oxide (hereinafter Ga$_{X4}$Zn$_{Y4}$O$_{Z4}$ (X4, Y4, and Z4 are real numbers greater than 0)), for example, so that a mosaic pattern is formed, and mosaic-like InO$_{X1}$ or In$_{X2}$Zn$_{Y2}$O$_{Z2}$ is evenly distributed in the film (which is hereinafter also referred to as cloud-like).

That is, the CAC-OS is a composite oxide semiconductor having a composition in which a region where GaO$_{X3}$ is a main component and a region where In$_{X2}$Zn$_{Y2}$O$_{Z2}$ or InO$_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

Meanwhile, the CAC-OS relates to the material composition of an oxide semiconductor.

The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where GaO$_{X3}$ is a main component and the region where In$_{X2}$Zn$_{Y2}$O$_{Z2}$ or InO$_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated, for example. In the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction measurement that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ or the like is a main component and regions where $In_{X2}Zn_{Y2}O_{Z2}$ or $InO_{X1}$ is a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other and form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through the regions where $In_{X2}Zn_{Y2}O_{Z2}$ or $InO_{X1}$ is a main component, the conductivity of an oxide semiconductor is exhibited. Accordingly, when the regions where $In_{X2}Zn_{Y2}O_{Z2}$ or $InO_{X1}$ is a main component are distributed like a cloud in an oxide semiconductor, high field-effect mobility (μ) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in an oxide semiconductor, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

Moreover, a semiconductor element using the CAC-OS has high reliability. Thus, the CAC-OS is suitable as a constituent material in a variety of semiconductor devices.

Figure 10A:
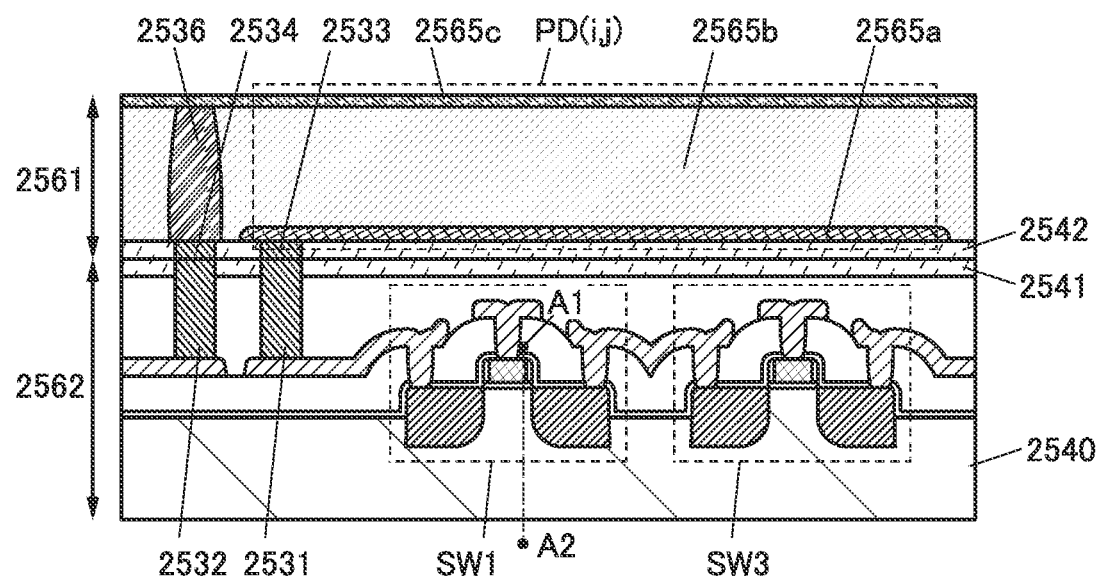
FIGS. 10A and 10B Diagrams illustrating structures of a pixel of an imaging device.

FIG. 10(A) is a diagram illustrating an example of a cross section of the pixel illustrated in FIG. 9(A). The layer 2561 includes a pn-junction photodiode with silicon for a photoelectric conversion layer, as the photoelectric conversion element PD(i,j). The layer 2562 includes a Si transistor, and FIG. 10(A) illustrates the switch SW1 and the switch SW3 included in the pixel circuit as an example.

In the photoelectric conversion element PD(i,j), the layer 2565a can be a $p^+$-type region, the layer 2565b can be an n-type region, and the layer 2565c can be an $n^+$-type region. In the layer 2565b, a region 2536 for connection between a power supply line and the layer 2565c is provided. For example, the region 2536 can be a $p^+$-type region.

Figure 11A:
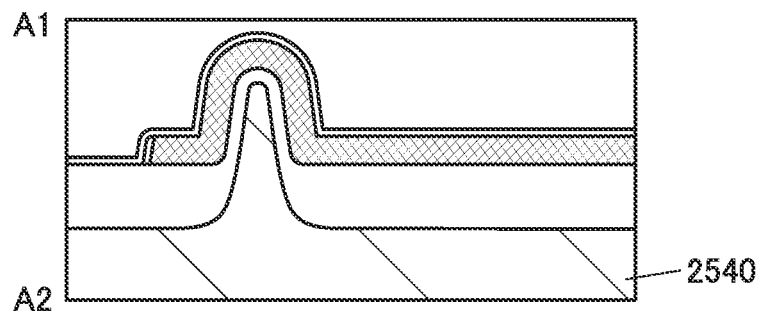
FIGS. 11A to 11C Diagrams illustrating transistors.
Figure 11B:
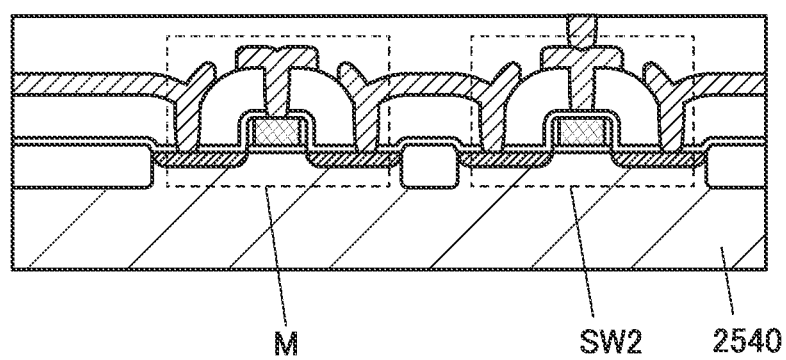

Note that the Si transistor illustrated in FIG. 10(A) is a fin-type transistor including a channel formation region in a silicon substrate 2540, and FIG. 11(A) shows a cross section in the channel width direction. The Si transistor may be a planar transistor as illustrated in FIG. 11(B).

Figure 11C:
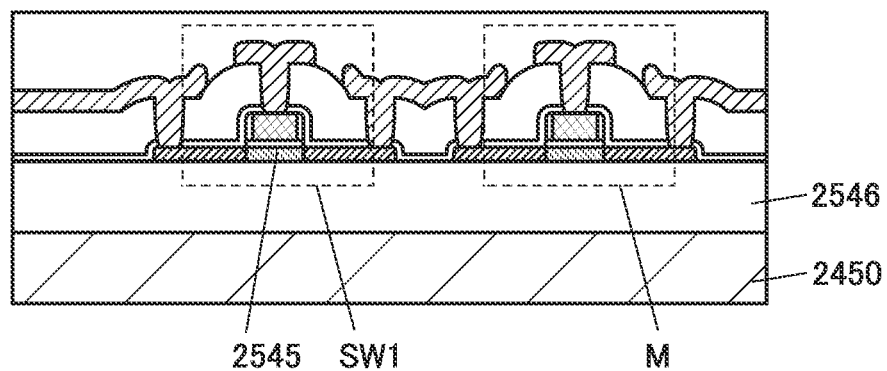

Alternatively, as illustrated in FIG. 11(C), transistors each including a semiconductor layer 2545 of a silicon thin film may be used. The semiconductor layer 2545 can be single crystal silicon (SOI (Silicon on Insulator)) formed on an insulating layer 2546 on the silicon substrate 2540, for example.

FIG. 10(A) illustrates a structure example in which electrical connection between elements of the layer 2561 and elements of the layer 2562 is obtained by bonding technique.

An insulating layer 2542, a conductive layer 2533, and a conductive layer 2534 are provided in the layer 2561. The conductive layer 2533 and the conductive layer 2534 each include a region embedded in the insulating layer 2542. The conductive layer 2533 is electrically connected to the layer 2565a. The conductive layer 2534 is electrically connected to the region 2536. Furthermore, surfaces of the insulating layer 2542, the conductive layer 2533, and the conductive layer 2534 are planarized to be level with each other.

An insulating layer 2541, a conductive layer 2531, and a conductive layer 2532 are provided in the layer 2562. The conductive layer 2531 and the conductive layer 2532 each include a region embedded in the insulating layer 2541. The conductive layer 2531 is electrically connected to a power supply line. The conductive layer 2532 is electrically connected to the source or the drain of a transistor used as the switch SW1. Furthermore, surfaces of the insulating layer 2541, the conductive layer 2531, and the conductive layer 2532 are planarized to be level with each other.

Here, main components of the conductive layer 2531 and the conductive layer 2533 are preferably the same metal element. Main components of the conductive layer 2532 and the conductive layer 2534 are preferably the same metal element. Furthermore, the insulating layer 2541 and the insulating layer 2542 are preferably formed of the same component.

For example, for the conductive layer 2531, the conductive layer 2532, the conductive layer 2533, and the conductive layer 2534, Cu, Al, Sn, Zn, W, Ag, Pt, Au, or the like can be used. Preferably, Cu, Al, W, or Au is used for easy bonding. In addition, for the insulating layers 2541 and 2542, silicon oxide, silicon oxynitride, silicon nitride oxide, silicon nitride, titanium nitride, or the like can be used.

That is, the same metal element described above is preferably used for a combination of the conductive layer 2531 and the conductive layer 2533 and the same metal element described above is preferably used for a combination of the conductive layer 2532 and the conductive layer 2534. Furthermore, the same insulating material described above is preferably used for the insulating layer 2541 and the insulating layer 2542. With this structure, bonding in which a boundary between the layer 2561 and the layer 2562 is a bonding position can be performed.

By the bonding, the electrical connection of each of the combination of the conductive layer 2531 and the conductive layer 2533 and the combination of the conductive layer 2532 and the conductive layer 2534 can be obtained. In addition, connection between the insulating layer 2541 and the insulating layer 2542 with mechanical strength can be obtained.

For bonding the metal layers to each other, a surface activated bonding method in which an oxide film, a layer adsorbing impurities, and the like on the surface are removed by sputtering treatment or the like and the cleaned and activated surfaces are brought into contact to be bonded to each other can be used. Alternatively, a diffusion bonding method in which the surfaces are bonded to each other by using temperature and pressure together or the like can be used. Both methods cause bonding at an atomic level, and therefore not only electrically but also mechanically excellent bonding can be achieved.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are brought into contact to be bonded to each other temporarily, and then dehydrated by heat treatment to perform final bonding. The hydrophilic bonding method can also cause bonding at an atomic level; thus, mechanically excellent bonding can be achieved.

When the layer 2561 and the layer 2562 are bonded together, the insulating layers and the metal layers coexist on their bonding surfaces; therefore, the surface activated bonding method and the hydrophilic bonding method are performed in combination, for example.

For example, a method in which the surfaces are cleaned after polishing, the surfaces of the metal layers are subjected to antioxidant treatment and then hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 10B:
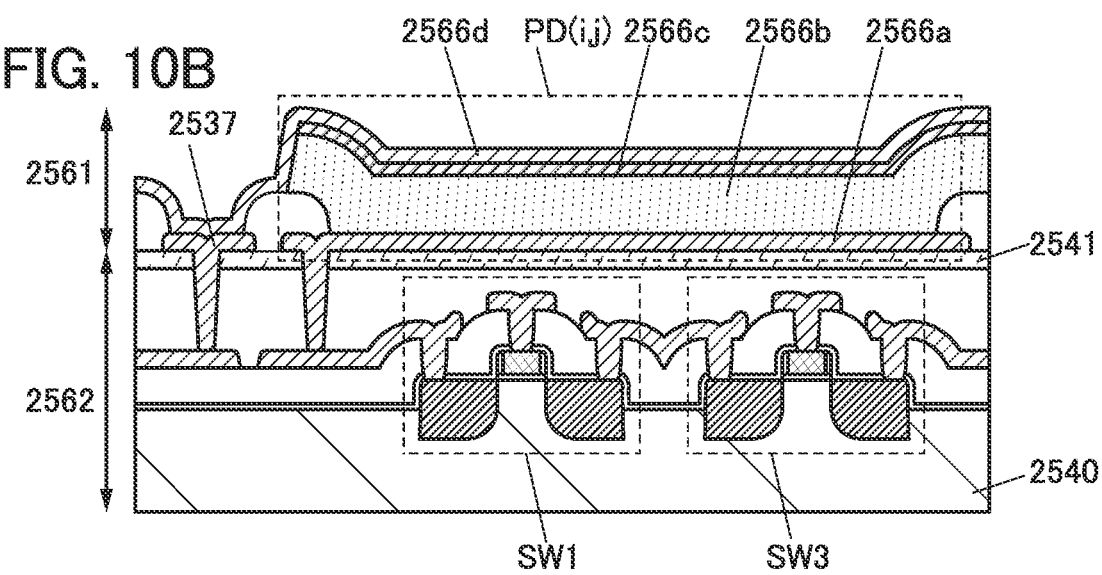

FIG. 10(B) is a cross-sectional view of the case where a pn-junction photodiode with a selenium-based material for a photoelectric conversion layer is used for the layer 2561 of the pixel illustrated in FIG. 9(A). The layer 2566a is included as one electrode, the layers 2566b and 2566c are included as the photoelectric conversion layer, and the layer 2566d is included as the other electrode.

In this case, the layer 2561 can be directly formed on the layer 2562. The layer 2566a is electrically connected to the source or the drain of the transistor used as the switch SW1. The layer 2566d is electrically connected to a power supply line through a conductive layer 2537. Note that also in the case where an organic optical conductive film is used as the layer 2561, a similar connection mode with the transistor is employed.

Figure 12A:
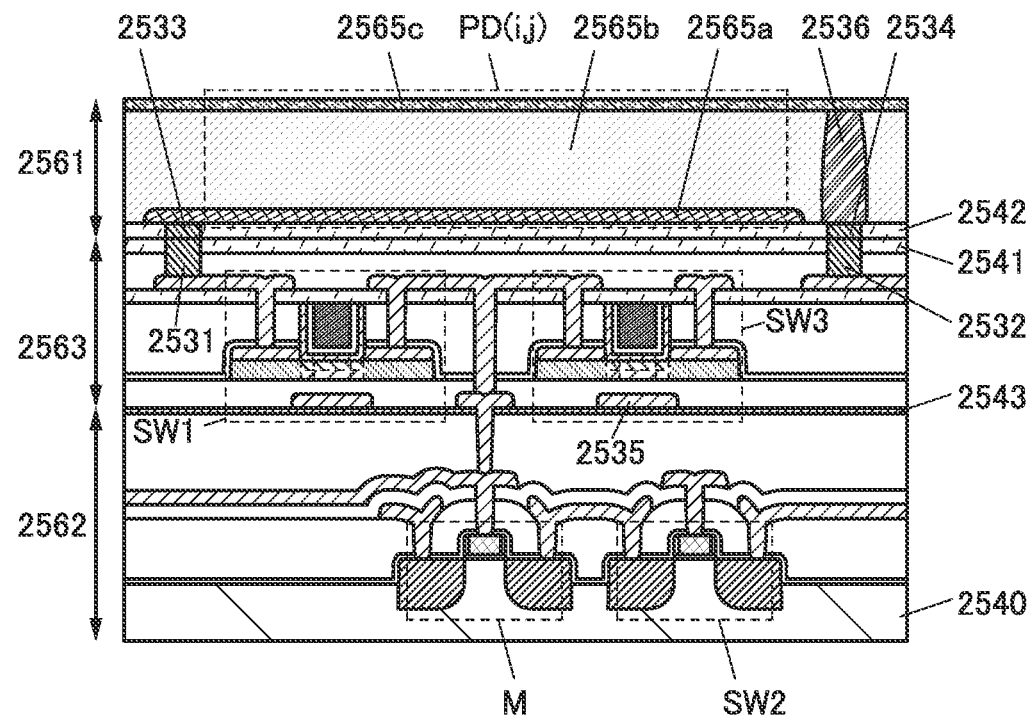
FIGS. 12A and 12B Diagrams illustrating structures of a pixel of an imaging device.

FIG. 12(A) is a diagram illustrating an example of a cross section of the pixel illustrated in FIG. 9(B). The layer 2561 includes a pn-junction photodiode using silicon for a photoelectric conversion layer, as the photoelectric conversion element PD(i,j). The layer 2562 includes a Si transistor, and FIG. 12(A) illustrates the transistor M and the switch SW2 included in the pixel circuit as an example. The layer 2562 includes an OS transistor, and FIG. 12(A) illustrates the switch SW1 and the switch SW3 included in the pixel circuit as an example. A structure example is illustrated in which electrical connection between the layer 2561 and the layer 2563 is obtained by bonding.

Figure 13A:
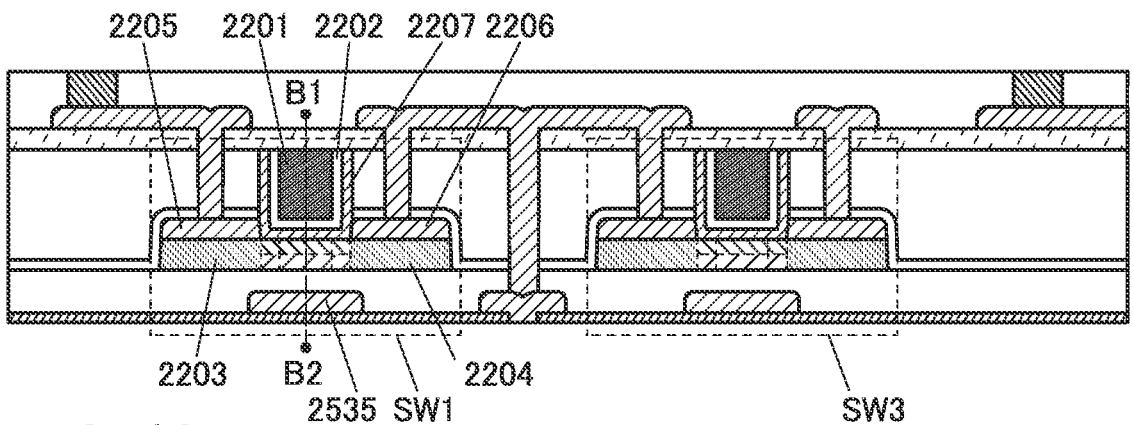
FIGS. 13A to 13D Diagrams illustrating transistors.

The details of the OS transistor is shown in FIG. 13(A). The OS transistor illustrated in FIG. 13(A) has a self-aligned structure in which an insulating layer is provided over a stacked layer of an oxide semiconductor layer and a conductive layer and a groove reaching the oxide semiconductor layer is provided, so that the source electrode 2205 and the drain electrode 2206 are formed.

The OS transistor can include a channel formation region, a source region 2203, and a drain region 2204, which are formed in the oxide semiconductor layer, a gate electrode 2201, and a gate insulating film 2202. At least the gate insulating film 2202 and the gate electrode 2201 are provided in the groove. The groove may further be provided with an oxide semiconductor layer 2207.

Figure 13B:
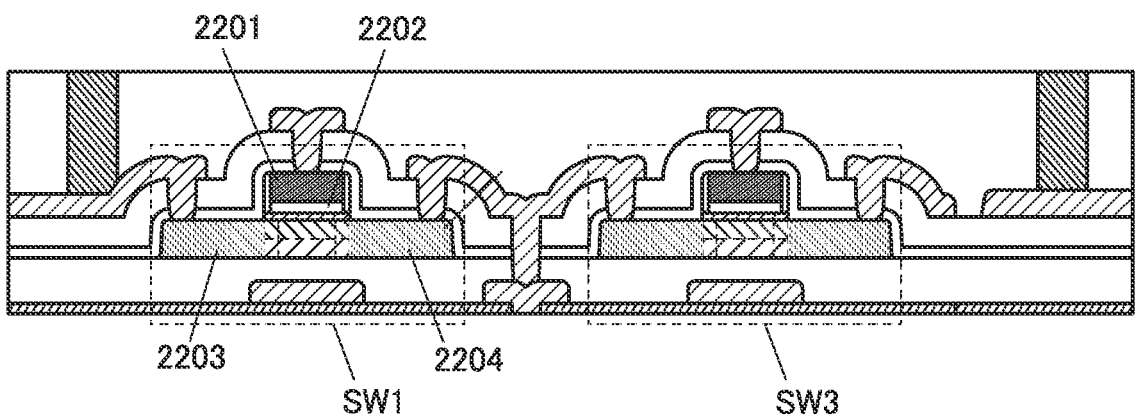

As illustrated in FIG. 13(B), the OS transistor may have a self-aligned structure in which the source region and the drain region are formed in a semiconductor layer with the gate electrode 2201 as a mask.

Figure 13C:
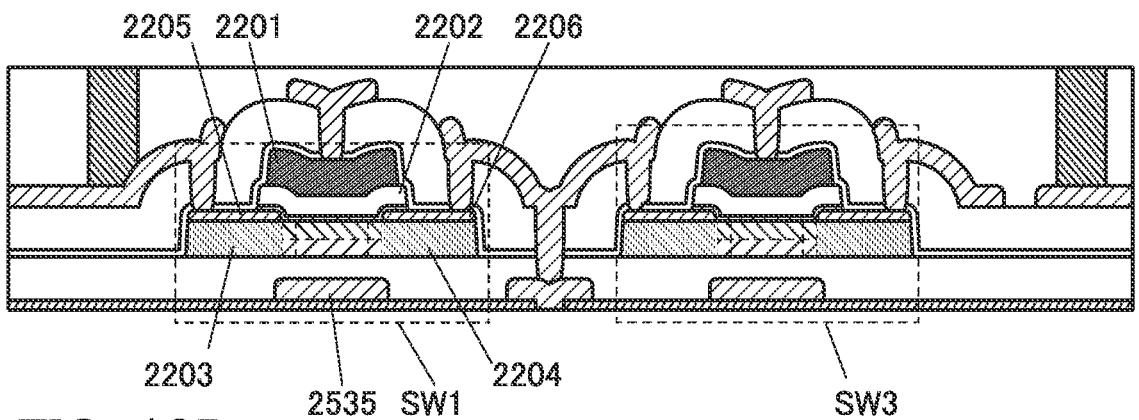

As illustrated in FIG. 13(C), the OS transistor may be a non-self-aligned top-gate transistor including a region where the source electrode 2205 or the drain electrode 2206 and the gate electrode 2201 overlap with each other.

Figure 13D:
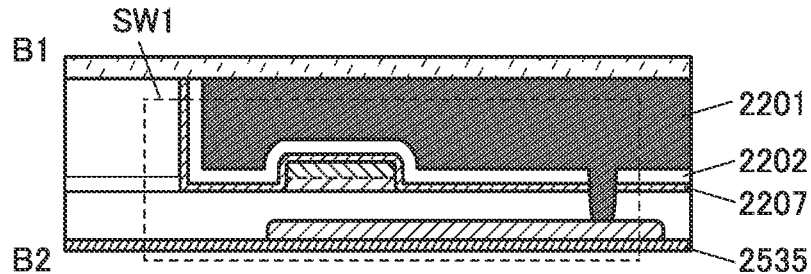

Although the structure in which the transistor used as the switch SW1 and the transistor used as the switch SW3 each include a back gate 2535 is shown, a structure not including the back gate may be employed. As illustrated in the cross-sectional view of the transistor in the channel width direction illustrated in FIG. 13(D), the back gate 2535 may be electrically connected to a front gate of the transistor that is provided to face the back gate 2535. Note that FIG. 13(D) shows the transistor in FIG. 12(A) as an example; however, the same applies to a transistor having any of the other structures. Alternatively, a structure in which a fixed potential different from that for the front gate can be supplied to the back gate 2535 may be employed.

An insulating layer 2543 that has a function of inhibiting diffusion of hydrogen is provided between a region where an OS transistor is formed and a region where Si transistors are formed. Dangling bonds of silicon are terminated with hydrogen in insulating layers provided in the vicinity of channel formation regions of the transistor M and the transistor used as the switch SW2. Meanwhile, hydrogen in an insulating layer provided in the vicinity of channel formation regions of the transistor used as the switch SW1 and the transistor used as the switch SW3 is one of the factors generating carriers in the oxide semiconductor layer.

Hydrogen is confined in one layer by the insulating layer 2543, so that the reliability of the transistor M and the transistor used as the switch SW2 can be improved. Furthermore, diffusion of hydrogen from the one layer to the other layer is inhibited, so that the reliability of the transistor used as the switch SW1 and the transistor used as the switch SW3 can also be improved.

For the insulating layer 2543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 12B:
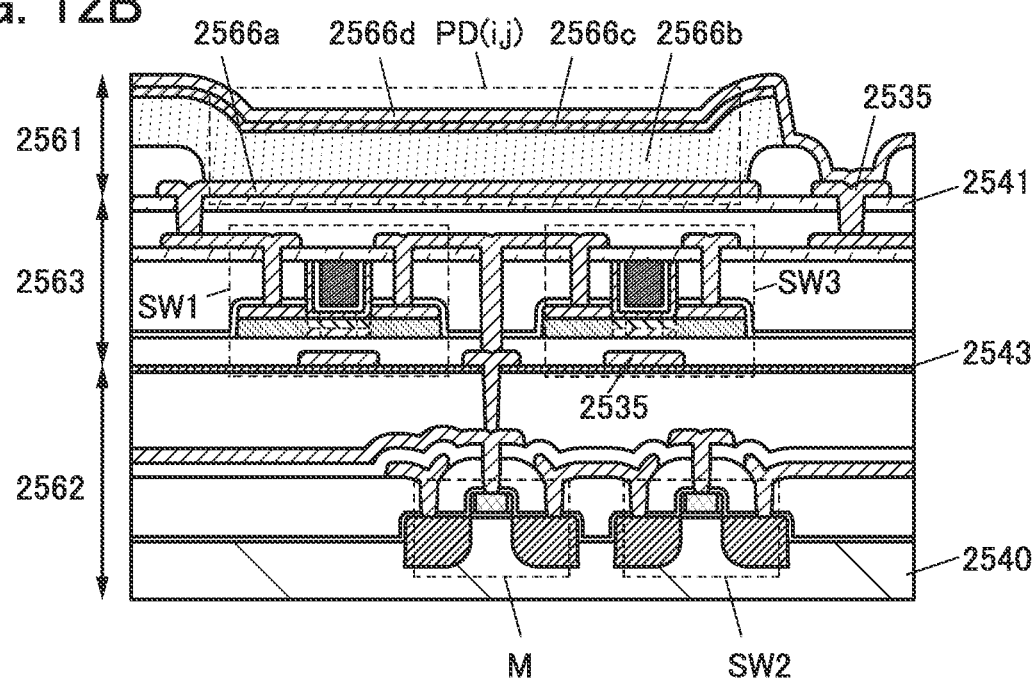

FIG. 12(B) is a cross-sectional view of the case where a pn-junction photodiode with a selenium-based material for a photoelectric conversion layer is used for the layer 2561 of the pixel illustrated in FIG. 9(B). The layer 2561 can be directly formed on the layer 2563. The above description can be referred to for the details of the layers 2561, 2562, and 2563. Note that also in the case where an organic optical conductive film is used as the layer 2561, a similar connection mode with the transistor is employed.

Figure 14A:
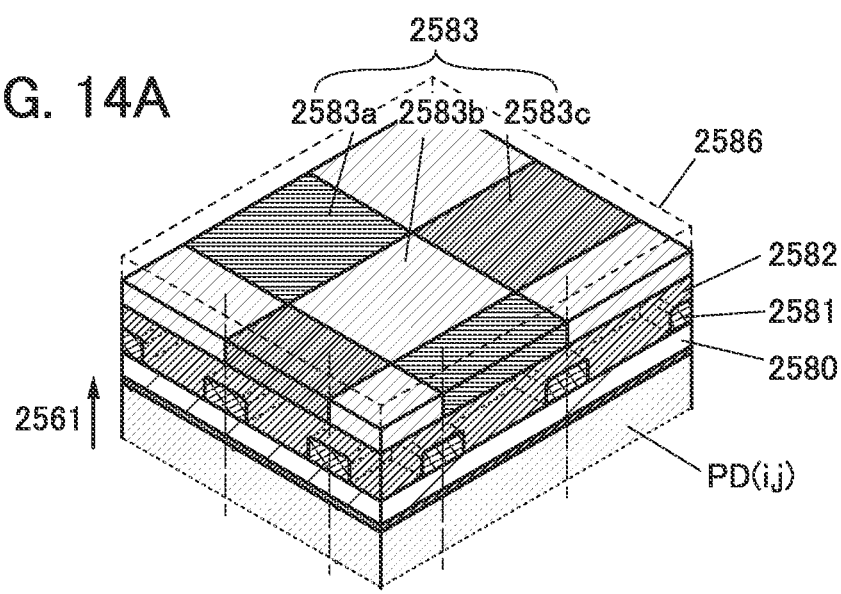
FIGS. 14A to 14C Diagrams illustrating structures of a pixel of an imaging device.

FIG. 14(A) is a perspective view illustrating an example in which a color filter and the like are added to the pixel of the imaging device of one embodiment of the present invention. In the perspective view, cross sections of the plurality of pixels are also illustrated. An insulating layer 2580 is formed over the layer 2561 where the photoelectric conversion element PD(i,j) is formed. As the insulating layer 2580, a silicon oxide film with a high visible light-transmitting property can be used, for example. A silicon nitride film may be stacked as a passivation film.

A dielectric film of hafnium oxide or the like may be stacked as an anti-reflection film.

A light-blocking layer 2581 may be formed over the insulating layer 2580. The light-blocking layer 2581 has a function of preventing color mixing of light passing through the upper color filter. As the light-blocking layer 2581, a metal layer of aluminum, tungsten, or the like can be used. The metal layer and a dielectric film having a function of an anti-reflection film may be stacked.

An organic resin layer 2582 can be provided as a planarization film over the insulating layer 2580 and the light-blocking layer 2581. A color filter 2583 (color filters 2583*a*, 2583*b*, and 2583*c*) is formed in each pixel. When colors of R (red), G (green), B (blue), Y (yellow), C (cyan), and M (magenta) are assigned to the color filters 2583*a*, 2583*b*, and 2583*c*, for example, a color image can be obtained.

An insulating layer 2586 or the like having a visible light-transmitting property can be provided over the color filter 2583.

Figure 14B:
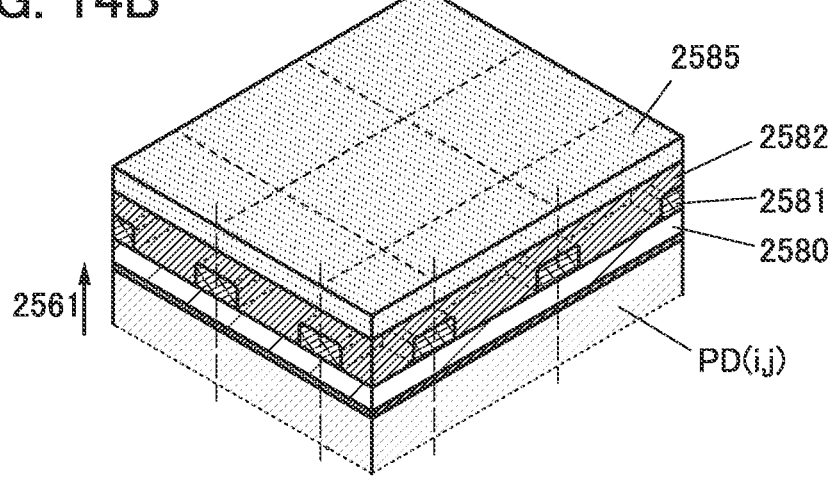

As illustrated in FIG. 14(B), an optical conversion layer 2585 may be used instead of the color filter 2583. Such a structure enables the imaging device capable of obtaining images in various wavelength regions.

When a filter that blocks light with a wavelength shorter than or equal to that of visible light is used as the optical conversion layer 2585, for example, it is possible to obtain an infrared imaging device. When a filter that blocks light with a wavelength shorter than or equal to that of near infrared light is used as the photoelectric conversion layer 2585, it is possible to obtain a far-infrared imaging device. When a filter that blocks light with a wavelength longer than or equal to that of visible light is used as the photoelectric conversion layer 2585, it is possible to obtain an ultraviolet imaging device.

Furthermore, when a scintillator is used as the optical conversion layer 2585, it is possible to obtain an imaging device that obtains an image visualizing the intensity of radiation and is used for an X-ray imaging device or the like. Radiations such as X-rays that pass through an object to enter a scintillator are converted into light (fluorescence) such as visible light or ultraviolet light owing to a photoluminescence phenomenon. Then, the light is detected by the photoelectric conversion element PD(i,j), whereby image data is obtained. Moreover, the imaging device having the above structure may be used in a radiation detector or the like.

A scintillator contains a substance that, when irradiated with radiation such as X-rays or gamma rays, absorbs energy thereof to emit visible light or ultraviolet light. For example, it is possible to use a resin or ceramics in which $Gd_2O_2S$:Tb, $Gd_2O_2S$:Pr, $Gd_2O_2S$:Eu, BaFC:Eu, NaI, CsI, $CaF_2$, $BaF_2$, $CeF_3$, LiF, LiI, ZnO, or the like is dispersed.

In the photoelectric conversion element PD(i,j) using a selenium-based material, radiation such as X-rays can be directly converted into charge; thus, a structure in which the scintillator is unnecessarily can also be employed.

Figure 14C:
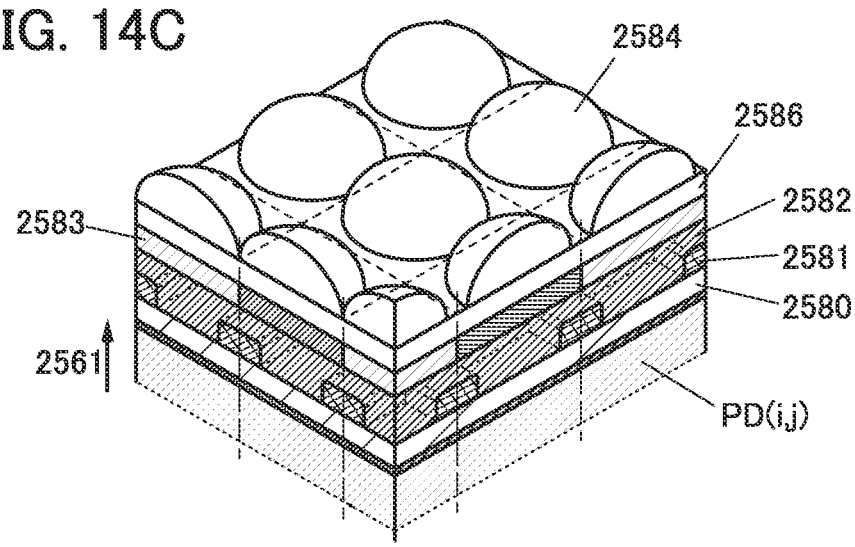

As illustrated in FIG. 14(C), a microlens array 2584 may be provided over the color filter 2583. Light passing through lenses of the microlens array 2584 goes through the color filter 2583 positioned thereunder and the photoelectric conversion element PD(i,j) is irradiated with the light. The microlens array 2584 may be provided over the optical conversion layer 2585 illustrated in FIG. 14(B).

Hereinafter, examples of a package and a camera module in each of which an image sensor chip is placed will be described. For the image sensor chip, the structure of the above-described imaging device can be used.

FIG. 15(A1) is an external perspective view of the top surface side of a package in which an image sensor chip is placed. The package includes a package substrate 2410 to which an image sensor chip 2450 is fixed, a cover glass 2420, an adhesive 2430 for bonding the package substrate 2410 and the cover glass 2420, and the like.

FIG. 15(A2) is an external perspective view of the bottom surface side of the package. A BGA (Ball grid array) in which solder balls serve as bumps 2440 is provided on the bottom surface of the package. Note that, not limited to the BGA, an LGA (Land grid array), a PGA (Pin Grid Array), or the like may be provided.

FIG. 15(A3) is a perspective view of the package, in which some parts of the cover glass 2420 and the adhesive 2430 are not illustrated. Electrode pads 2460 are formed over the package substrate 2410, and the electrode pads 2460 and the bumps 2440 are electrically connected via through-holes. The electrode pads 2460 are electrically connected to the image sensor chip 2450 through wires 2470.

Furthermore, FIG. 15(B1) is an external perspective view of the top surface side of a camera module in which an image sensor chip is placed in a package with a built-in lens. The camera module includes a package substrate 2411 to which an image sensor chip 2451 is fixed, a lens cover 2421, a lens 2435, and the like. Furthermore, an IC chip 2490 having functions of a driver circuit, a signal conversion circuit, and the like of an imaging device is provided between the package substrate 2411 and the image sensor chip 2451; thus, the structure as an SiP (System in package) is included.

FIG. 15(B2) is an external perspective view of the bottom surface side of the camera module. On the bottom surface and side surfaces of the package substrate 2411, a QFN (Quad flat no-lead package) structure in which lands 2441 for mounting are provided is used. Note that this structure is an example, and a QFP (Quad flat package) or the above-mentioned BGA may be employed.

FIG. 15(B3) is a perspective view of the module, in which some parts of the lens cover 2421 and the lens 2435 are not illustrated. The lands 2441 are electrically connected to electrode pads 2461, and the electrode pads 2461 are electrically connected to the image sensor chip 2451 or the IC chip 2490 through wires 2471.

The image sensor chip placed in a package having the above form can be easily mounted on a printed substrate or the like, and the image sensor chip can be incorporated into a variety of semiconductor devices and electronic devices.

This embodiment can be combined with any of the other embodiments as appropriate.

Embodiment 4

Examples of an electronic device that can use the imaging device of one embodiment of the present invention include display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 16(A) to FIG. 16(F) illustrate specific examples of these electronic devices.

Figure 16A:
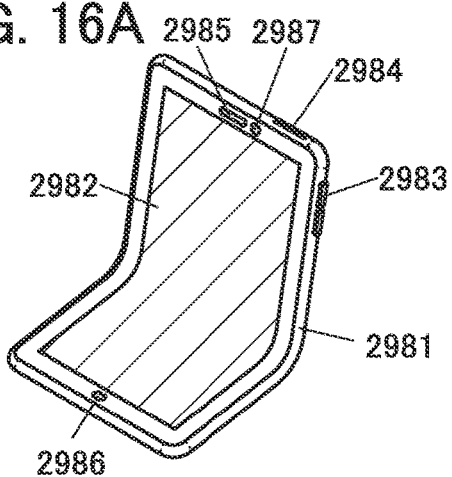
FIGS. 16A to 16F Diagrams illustrating electronic devices.

FIG. 16(A) shows an example of a mobile phone that includes a housing 2981, a display portion 2982, an operation button 2983, an external connection port 2984, a speaker 2985, a microphone 2986, a camera 2987, and the like. The display portion 2982 of the mobile phone includes a touch sensor. All operations including making a call and inputting text can be performed by touch on the display portion 2982 with a finger, a stylus, or the like. The imaging device of one embodiment of the present invention and the operation method of the imaging device can be used for obtaining an image in the mobile phone.

Figure 16B:
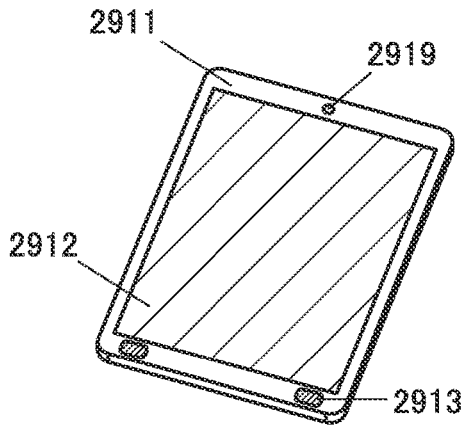

FIG. 16(B) illustrates a portable data terminal, which includes a housing 2911, a display portion 2912, speakers 2913, a camera 2919, and the like. A touch panel function of the display portion 2912 enables input and output of information. Furthermore, a character or the like in an image that is captured by the camera 2919 can be recognized and the character can be voice-output from the speaker 2913. The imaging device of one embodiment of the present invention and the operation method of the imaging device can be used for obtaining an image in the portable data terminal.

Figure 16C:
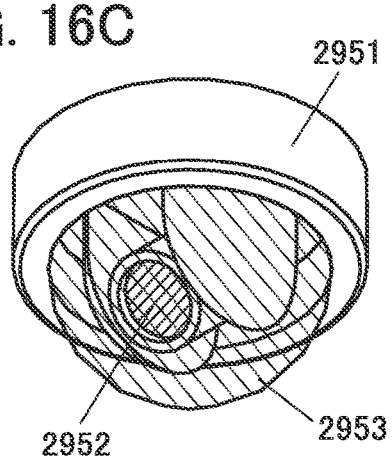

FIG. 16(C) is a surveillance camera, which includes a support base 2951, a camera unit 2952, a protection cover 2953, and the like. The camera unit 2952 is provided with a rotation mechanism and the like and can capture an image of all of the surroundings when provided on a ceiling. The imaging device of one embodiment of the present invention and the operation method of the imaging device can be used for obtaining an image in the camera unit. Note that a surveillance camera is a name in common use and does not limit the use thereof. For example, a device that has a function of a surveillance camera can also be called a camera or a video camera.

Figure 16D:
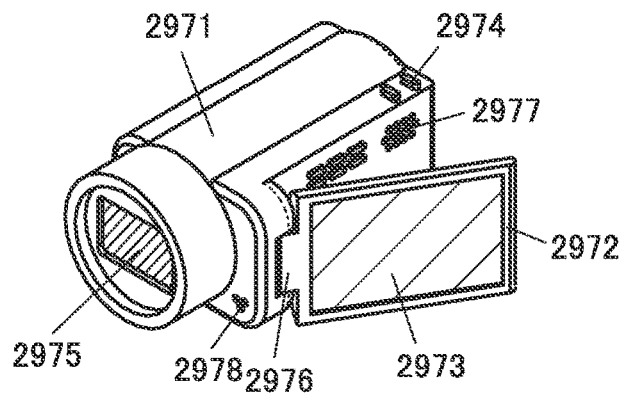

FIG. 16(D) illustrates a video camera, which includes a first housing 2971, a second housing 2972, a display portion 2973, operation keys 2974, a lens 2975, a joint 2976, a speaker 2977, a microphone 2978, and the like. The operation keys 2974 and the lens 2975 are provided for the first housing 2971, and the display portion 2973 is provided for the second housing 2972. The imaging device of one embodiment of the present invention and the operation method of the imaging device can be used for obtaining an image in the video camera.

Figure 16E:
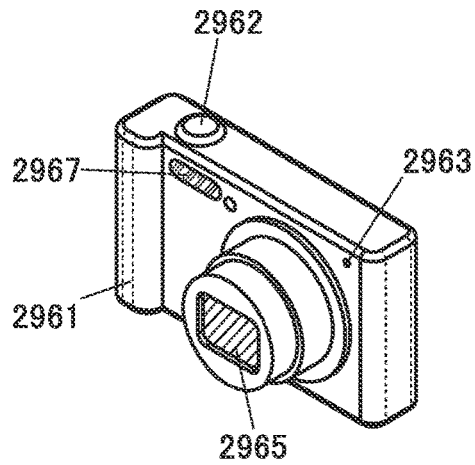

FIG. 16(E) illustrates a digital camera, which includes a housing 2961, a shutter button 2962, a microphone 2963, a light-emitting portion 2967, a lens 2965, and the like. The imaging device of one embodiment of the present invention and the operation method of the imaging device can be used for obtaining an image in the digital camera.

Figure 16F:
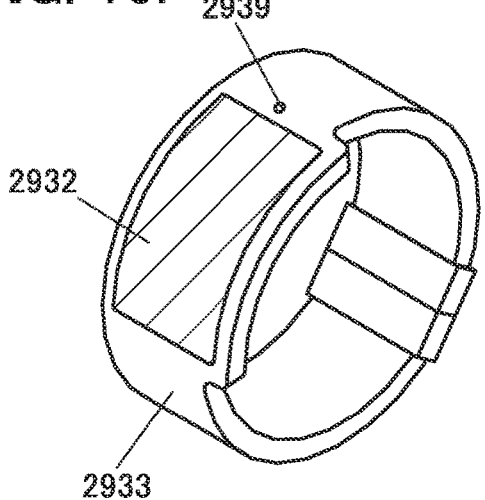

FIG. 16(F) illustrates a wrist-watch-type information terminal, which includes a display portion 2932, a housing 2933 also serving as a wristband, a camera 2939, and the like. The display portion 2932 is provided with a touch panel for operating the information terminal. The display portion 2932 and the housing 2933 also serving as a wristband have flexibility and fit a body well. The imaging device of one embodiment of the present invention and the operation method of the imaging device can be used for obtaining an image in the information terminal.

This embodiment can be combined with any of the other embodiments as appropriate.

Embodiment 5

In this embodiment, a structure of an imaging device of one embodiment of the present invention will be described with reference to FIG. 17.

FIG. 17 is a diagram illustrating a structure of the imaging device of one embodiment of the present invention.

Structure Example 1 of Imaging Device

Figure 17A:
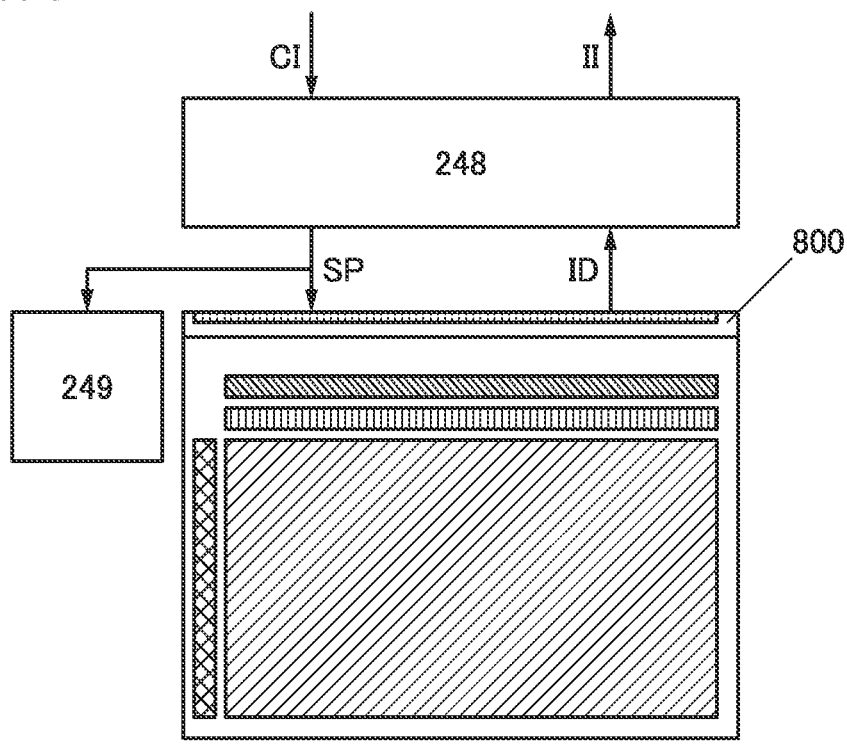
FIGS. 17A to 17D Diagrams illustrating structures of imaging devices of embodiments.

The imaging device described in this embodiment includes a light source 249, the imaging panel 800, and a control portion 248 (see FIG. 17(A)).

Structure Example of Light Source 249

A light-emitting diode can be used as the light source 249, for example. Specifically, a laser diode can be used as the light source 249. For example, a near-infrared laser diode can be used.

The light source 249 emits pulsed light on the basis of a control signal SP.

Structure Example of Imaging Panel 800

The imaging panel 800 performs imaging on the basis of the control signal SP.

Structure Example of Control Portion 248

The control portion 248 is supplied with control information CI and image data ID.

The control portion 248 supplies the control signal SP on the basis of the control information CI.

The control portion 248 supplies image information II on the basis of the image data ID.

Accordingly, the time from light emission to imaging can be recorded. Alternatively, the distance from the imaging device to a subject can be measured by a time-of-flight method.

As a result, a novel imaging device that is highly convenient or reliable can be provided.

Structure Example 2 of Imaging Device

The imaging device 5200B described in this embodiment includes an arithmetic device 5210, a display portion 5230, an input portion 5240, a sensing portion 5250, and a communication portion 5290 and has a function of supplying operation information and a function of being supplied with image information. The imaging panel of one embodiment of the present invention can be used for the sensing portion 5250, for example.

Figure 17B:
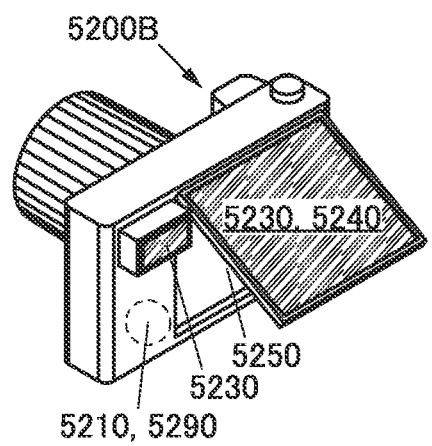
Figure 17C:
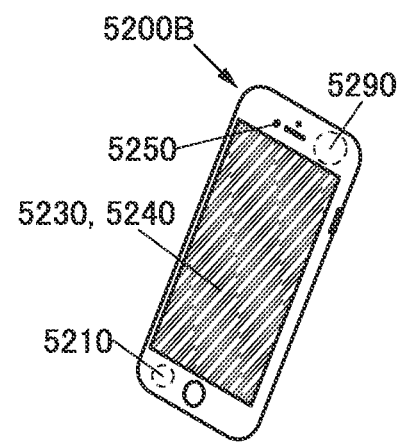
Figure 17D:
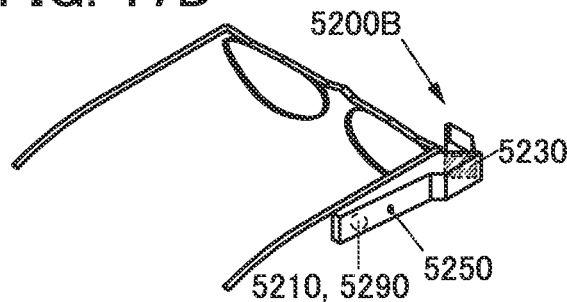

Specifically, the imaging panel of one embodiment of the present invention can be used for a digital camera (see FIG. 17(B)). Alternatively, the imaging panel of one embodiment of the present invention can be used for a portable information communication device (see FIG. 17(C)). Alternatively, the imaging panel of one embodiment of the present invention can be used for a display device for augmented reality (see FIG. 17(D)).

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

C1: capacitor, C2: capacitor, FD1(i,j): node, FD2(i,j): node, ID: image data, IS: image signal, SW1: switch, SW2: switch, SW3: switch, SW4: switch, SW5: switch, T0: period, T1: period, T2: period, T3: period, T11: period, T12: period,
T13: period, T14: period, 241: imaging region, 248: control portion, 249: light source, 430(i,j): pixel circuit, 800: imaging panel, 802(i,j): pixel, 2201: gate electrode, 2202: gate insulating layer, 2203: source region, 2204: drain region, 2205: source electrode, 2206: drain electrode, 2207: oxide semiconductor layer, 2410: package substrate, 2411: package substrate, 2420: cover glass, 2421: lens cover, 2430: adhesive, 2435: lens, 2440: bump, 2441: land, 2450: image sensor chip, 2451: image sensor chip, 2460: electrode pad, 2461: electrode pad, 2470: wire, 2471: wire, 2490: IC chip, 2531: conductive layer, 2532: conductive layer, 2533: conductive layer, 2534: conductive layer, 2535: back gate, 2536: region, 2540: silicon substrate, 2541: insulating layer, 2542: insulating layer, 2543: insulating layer, 2545: semiconductor layer, 2546: insulating layer, 2561: layer, 2562: layer, 2563: layer, 2565a: layer, 2565b: layer, 2565c: layer, 2566a: layer, 2566b: layer, 2566c: layer, 2566d: layer, 2567a: layer, 2567b: layer, 2567c: layer, 2567d: layer, 2567e: layer, 2580: insulating layer, 2581: light-blocking layer, 2582: organic resin layer, 2583: color filter, 2583a: color filter, 2583b: color filter, 2583c: color filter, 2584: microlens array, 2585: optical conversion layer, 2586: insulating layer, 2911: housing, 2912: display portion, 2913: speaker, 2919: camera, 2932: display portion, 2933: housing also serving as a wristband, 2939: camera, 2951: support base, 2952: camera unit, 2953: protection cover, 2961: housing, 2962: shutter button, 2963: microphone, 2965: lens, 2967: light-emitting portion, 2971: housing, 2972: housing, 2973: display portion, 2974: operation key, 2975: lens, 2976: connection portion, 2977: speaker, 2978: microphone, 2981: housing, 2982: display portion, 2983: operation button, 2984: external connection port, 2985: speaker, 2986: microphone, 2987: camera, 5200B: imaging device, 5210: arithmetic device, 5230: display portion, 5240: input portion, 5250: sensing portion, 5290: communication portion

The invention claimed is:

1. An imaging panel comprising:
a photoelectric conversion element, a first pixel comprising a first pixel circuit, a first conductive film supplied with an image signal, a second conductive film, a third conductive film, a fourth conductive film, and a fifth conductive film,
wherein a first terminal of the photoelectric conversion element is electrically connected to the second conductive film,
wherein the first pixel circuit comprises a first transistor, a second transistor, a third transistor, a fourth transistor, a fifth transistor, and a capacitor,
wherein one of a source and a drain of the first transistor is electrically connected to a second terminal of the photoelectric conversion element,
wherein the other one of the source and the drain of the first transistor is electrically connected to a node,
wherein a gate of the fourth transistor is electrically connected to the node,
wherein one of a source and a drain of the fourth transistor is electrically connected to the third conductive film,
wherein one of a source and a drain of the second transistor is electrically connected to the other of the source and the drain of the fourth transistor,
wherein the other of the source and the drain of the second transistor is electrically connected to the first conductive film,
wherein one of a source and a drain of the third transistor is electrically connected to the fourth conductive film,
wherein the other of the source and the drain of the third transistor is directly connected to the node,
wherein one of a source and a drain of the fifth transistor is electrically connected to the fourth conductive film,
wherein the other of the source and the drain of the fifth transistor is electrically connected to the other one of the source and the drain of the first transistor,
wherein a gate of the fifth transistor is electrically connected to a second pixel comprising a second pixel circuit,
wherein the first pixel and the second pixel are arranged in a row direction,
wherein a first electrode of the capacitor is electrically connected to the node, and
wherein a second electrode of the capacitor is electrically connected to the fifth conductive film.

2. The imaging panel according to claim 1, further comprising a third pixel circuit of a third pixel,
wherein the first pixel and the third pixel are arranged in a column direction, and
wherein the third pixel circuit is electrically connected to the second terminal of the photoelectric conversion element without connecting through another photoelectric conversion element.

3. The imaging panel according to claim 1, further comprising a selection line driver circuit electrically connected to gates of the first transistor, the second transistor, and the third transistor.

4. The imaging panel according to claim 1, further comprising a signal line driver circuit configured to supply weight data to the fifth conductive film.

5. An imaging device comprising the imaging panel according to claim 1.

* * * * *